(12) United States Patent
White

(10) Patent No.: US 8,921,802 B2
(45) Date of Patent: Dec. 30, 2014

(54) MASS ANALYZER APPARATUS AND SYSTEMS OPERATIVE FOR FOCUSING RIBBON ION BEAMS AND FOR SEPARATING DESIRED ION SPECIES FROM UNWANTED ION SPECIES IN RIBBON ION BEAMS

(76) Inventor: Nicholas R. White, Manchester, MA (US)

( * ) Notice: Subject to any disclaimer, the term of this patent is extended or adjusted under 35 U.S.C. 154(b) by 75 days.

(21) Appl. No.: 13/385,618

(22) Filed: Feb. 27, 2012

(65) Prior Publication Data

US 2012/0235053 A1 Sep. 20, 2012

Related U.S. Application Data

(60) Provisional application No. 61/465,303, filed on Mar. 17, 2011.

(51) Int. Cl.

| | | |
|---|---|---|
| H01J 3/20 | (2006.01) | |
| H01J 37/14 | (2006.01) | |
| H01J 3/22 | (2006.01) | |
| H01J 3/24 | (2006.01) | |
| H01J 37/05 | (2006.01) | |
| H01J 37/317 | (2006.01) | |
| H01J 49/06 | (2006.01) | |
| H01J 49/20 | (2006.01) | |

(52) U.S. Cl.
CPC ... *H01J 3/22* (2013.01); *H01J 3/24* (2013.01); *H01J 37/05* (2013.01); *H01J 37/14* (2013.01); *H01J 37/3171* (2013.01); *H01J 49/06* (2013.01); *H01J 49/20* (2013.01); *H01J 2237/055* (2013.01); *H01J 2237/057* (2013.01)
USPC .............................. 250/396 ML; 250/492.21

(58) Field of Classification Search
USPC ...................... 250/396 ML, 492.21
See application file for complete search history.

(56) References Cited

U.S. PATENT DOCUMENTS

| | | | | |
|---|---|---|---|---|
| 6,498,348 | B2 * | 12/2002 | Aitken | 250/396 ML |
| 7,078,713 | B2 * | 7/2006 | White | 250/492.21 |
| 7,635,850 | B2 * | 12/2009 | Yamashita et al. | 250/492.21 |
| 2010/0116983 | A1 * | 5/2010 | Benveniste et al. | 250/298 |
| 2010/0327181 | A1 * | 12/2010 | Ryding et al. | 250/424 |

* cited by examiner

*Primary Examiner* — Nicole Ippolito
*Assistant Examiner* — Eliza Osenbaugh-Stewart

(57) ABSTRACT

The present invention is an apparatus and multi-unit assembly which is able to achieve two different and highly desirable functions: A focusing of a charged particle beam; and a mass separation of desired ion species from unwanted ion species in traveling ion beams. The apparatus is a simply organized and easily manufactured article; is relatively light-weight and less expensive to make; and is easier to install, align, and operate than conventionally available devices.

17 Claims, 15 Drawing Sheets

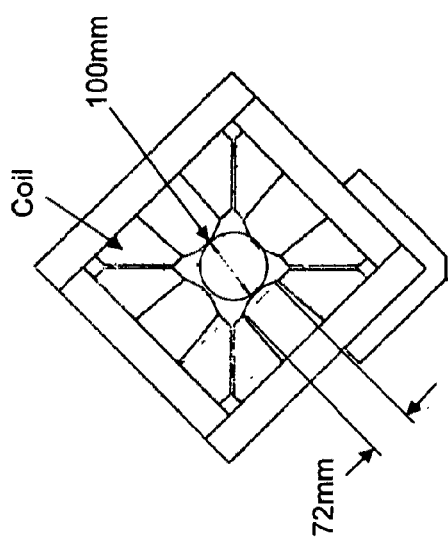
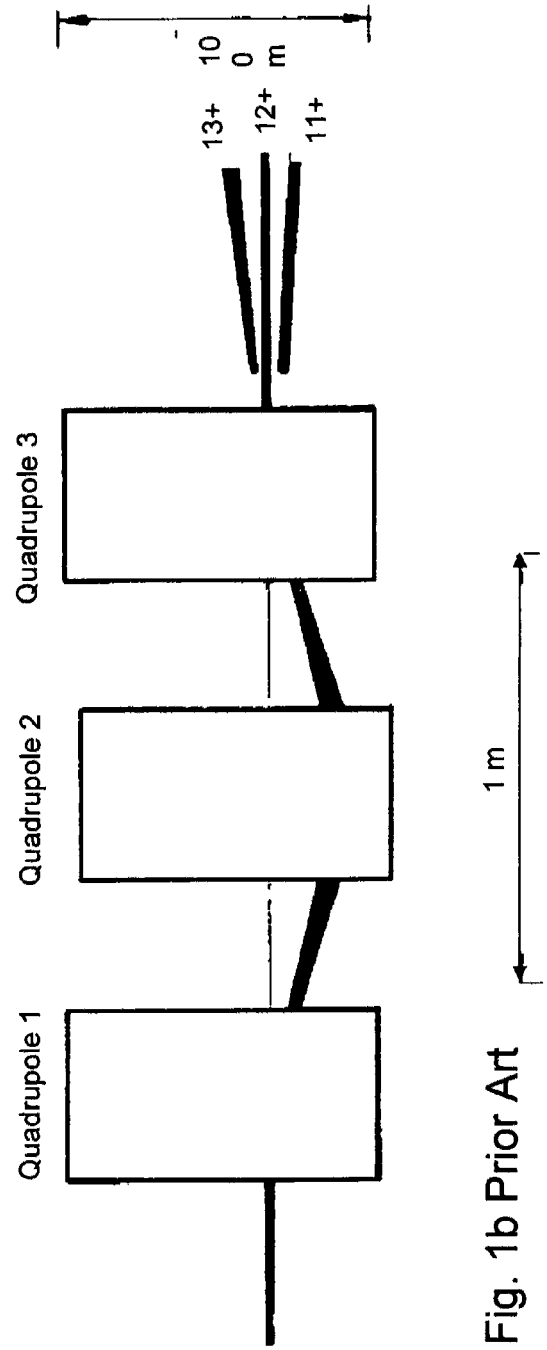
Fig. 1a Prior Art
Fig. 1b Prior Art

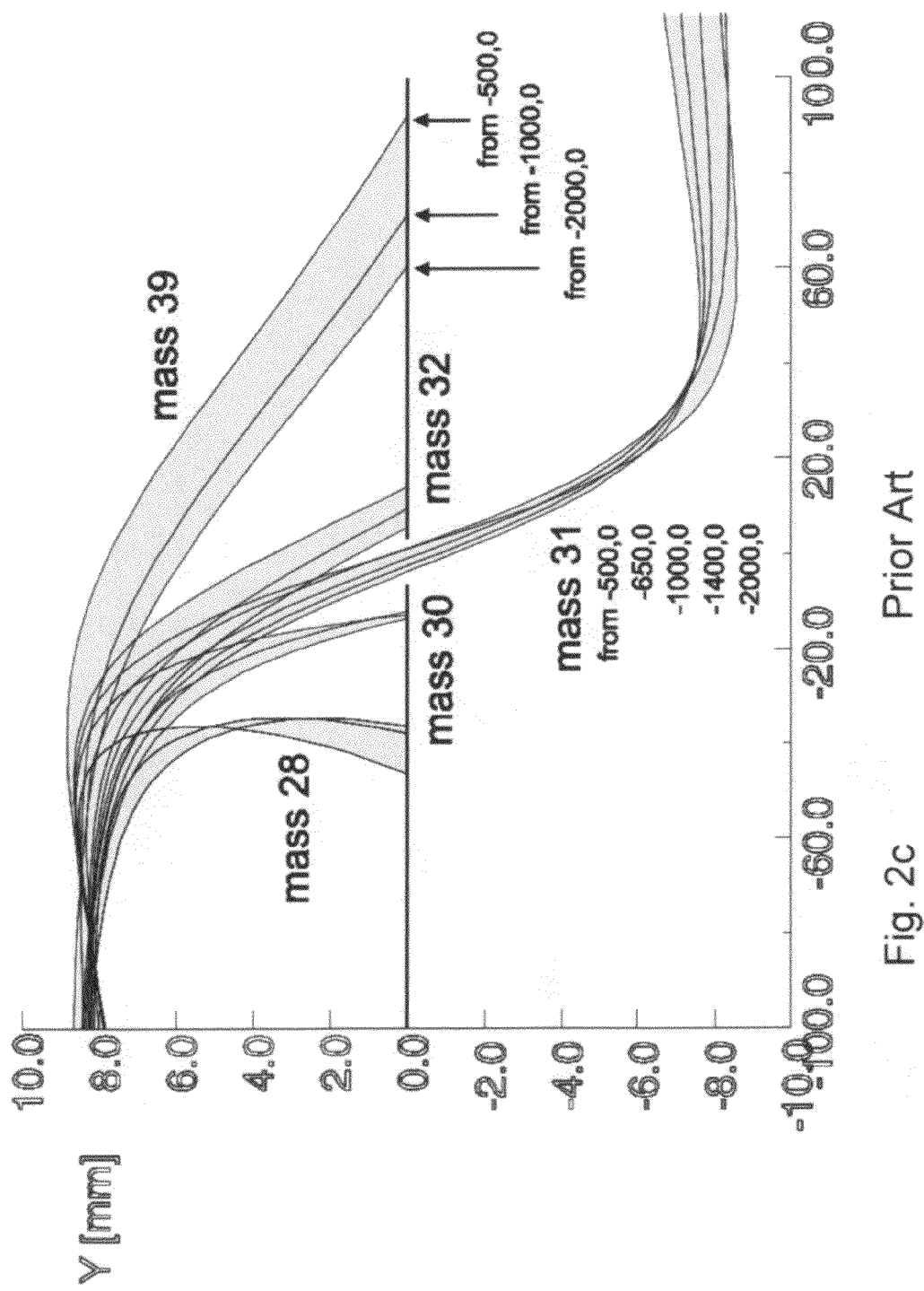

MASS ANALYZER APPARATUS AND SYSTEMS OPERATIVE FOR FOCUSING RIBBON ION BEAMS AND FOR SEPARATING DESIRED ION SPECIES FROM UNWANTED ION SPECIES IN RIBBON ION BEAMS

PRIORITY CLAIM

This invention was first filed on Mar. 17, 2011 as U.S. Provisional Patent Application Ser. No. 61/465,303. The priority date and legal benefits of this first filing are expressly claimed hereby.

FIELD OF THE INVENTION

The present invention concerns magnetic lenses which are applied to ribbon-shaped ion beams in ion implantation apparatus and systems for the purpose of selecting desired ions by mass, as well as for focusing. In such systems, the ribbon-shaped ion beams and the lenses would ideally have planar symmetry, with a constant cross section in the width dimension, over a distance many times greater than the narrow beam dimension.

BACKGROUND OF THE INVENTION

Underlying Facts and Historical Considerations

The use of magnetic lens for focusing purposes is conventional and long known; and the use of offset magnetic quadrupole lenses to separate particles of differing rigidities (for example, different charge states in Tandem Van de Graaf accelerators) is well known in the field.

It is desirable to purify large ribbon-shaped ion beams by mass selection for purposes of ion implantation into large substrates such as flat-panel displays and solar cells. A desirable feature of a magnetic device which can be extended and lengthened to an arbitrary size in one dimension is that the generated magnetic field should have no component in this length-extended dimension. Otherwise, as the device is extended in this length dimension, the number of ampere turns required to generate the required field increases, there is a tendency for flux leakage to flow from the device, and the size and weight of the device grow inconveniently large. The occurrence of either or both of these events is undesirable; nevertheless, these disadvantageous factors continue to appear repeatedly and must be routinely compensated for—owing to the fact that it is today conventional to use such a dimension-extended magnetic field for mass separation.

On the other hand, a magnetic field lying in a plane in which the ion travel trajectories are moving does not directly introduce any useful deflection or dispersion in that plane. A focusing of such ion travel pathways will generally occur when field gradients are present; and an important example is the well-known case of the focusing between the inclined entrance and the exit poles of a dipole magnet, where the focusing arises in the fringe field [as described by Enge in several publications including Septier and Septier eds., *Focusing of Charged Particles*, Chapter 4.2, Vol 2 p. 203, A.P. (1967); and by A. P. Banford, *Transport of Charged Particle Beams* (Spon, 1966)].

What the Relevant Prior Art Factually Suggests

1. By analogy with chromatic aberration in glass lenses [as described by Sir Isaac Newton in *Opticks,* 4th Ed, London, 1730], chromatic aberration in ion and electron lenses identifies and is defined as the variation of the focusing or deflecting strength of the lens as a function of a property of the ions known as 'magnetic rigidity', and which is defined as the ratio of momentum to charge. The deflection of ions in a magnetic field is inversely proportional to magnetic rigidity.

As an aid for proper understanding of what the prior art suggests, Prior Art FIG. 1a is shows a conventionally known magnetic quadrupole lens; and Prior Art FIG. 1b shows a triplet of such lenses through which an ion beam is passed off-center. As would be the case with light beams of different color which pass off-center through alternating focusing and defocusing lenses, the ion beams of differing magnetic rigidity exit the lens in different directions. In this case the desired beam is undeflected—but in fact has undergone some useful focusing. Eastham, Joy and Tait reported the use of this device in 1973 [*Nuclear Instruments and Methods*, Vol. 117, 1974, pp. 495-500] to separate ions of the same momentum, but having differing charges. Thus the use of offset quadrupole magnetic lenses for selecting ions of a given mass from a beam containing other ion species (mass selection) would be an obvious extension of this technique.

Furthermore, in 2002 Aitken reported the application of focusing devices with chromatic aberration to the separation of ribbon-shaped ion beams [see Aitken, 14th International Conference on Ion Implantation Technology, 2002, IEEE, pages 448-451]. Attention is directed to Prior Art FIG. 2a which illustrates that the Aitken 2002 apparatus shears a travelling ribbon-shaped ion beam first in one direction, and then in the other direction. The side view shown by Prior Art FIG. 2b illustrates the strong focusing that accompanies this kind of shearing effect, and also illustrates the use of a beam stop on the midplane to intercept the unwanted ion species. Attention is also directed to Prior Art FIG. 2c which shows the travel paths of beams of ions having different magnetic rigidities, thereby demonstrating potentially useful mass separation properties.

2. In addition, it is known that microwave ion sources commonly utilize a cylindrically symmetric solenoidal magnetic field. Thus for example, in the Eaton Nova NV200 oxygen ion implanter (commercially available in 1987), an additional solenoid is used to focus a cylindrical-shaped ion beam. In 1990, a slot-shaped aperture was used in a later version of this ion source at IBIS Technology Corp, and appeared in the commercially available IBIS 1000 ion implanter. The amount of shearing of the ion beam caused by the modification of the solenoid to planar symmetry was then evaluated and accurately determined.

This effect is described by Busch's Theorem, which states that the amount of angular momentum imparted to a charged particle beam passing through two successive planes is proportional to the change in magnetic flux passing through the cross sections of the beam at the reference planes. However, if the traveling particle beams are not cylindrically symmetric, this angular momentum is manifested as a shearing effect. The shearing in the IBIS 1000 ion implanter was found to be significant but tolerable, given that the ion beam in question was used at energies above about 50 keV, but at lower energies it would have had adverse effects.

With a traveling ribbon-shaped ion beam, as well as with corresponding magnetic components having a planar symmetry (as opposed to those having a cylindrical symmetry)—the combination of this shearing, the generating skewed trajectories, and the passage of the ions though an axially directed field meaningfully modifies the focusing properties. Focusing arises from the combination of the passage of the ions through a fringe field (which introduces a skew) and the subsequent interaction of the ions with the solenoidal field.

Thus, under properly set and maintained operational conditions, useful focusing may sometimes appear as a consequence shearing of the traveling ribbon-shaped ion beam.

It is noted also here that the use of opposing solenoidal fields (a common method in electron lenses to avoid image rotation) could potentially be used to reduce the shearing of the traveling ribbon-shaped ion beam. In 1990-1991 technology terms, this potential capability was deemed to not be worth the added complication for the ribbon-shaped ion beam application. But, with the advances of the past 20 years, the use of ribbon-shaped ion beams and lower energies have both have both become commonplace (if not the true industry standard); and the diverse improvements over the basic 1990-1991 system concept have had many practical applications and marked developments.

Today's True Technological Needs and Perspectives

In today's technology, much interest has been directed towards developing methods for separating desired ion species from unwanted or contaminant ion species in purposely prepared ribbon-shaped ion beams; and at the same time, as the desirable axial dimensions and currents in these ribbon-shaped beams are increasing, new applications of such ion implantation systems are being utilized (such as doping flat panel displays and making large area solar cells). Examples of analyzer devices for purifying ribbon-shaped ion beams have included conventional analyzing magnets which bend the travelling ion beam in the plane of its major dimension [see for example, U.S. Pat. No. 5,350,925]; and modified magnets which bend the travelling ion beam in the plane of its minor dimension [see for example, U.S. Pat. No. 7,112,789].

A. Some of the recent developments in analyzing large ribbon-shaped ion beams include: The Satoh window frame magnet assembly which comprises two pairs of coils orthogonally arranged within a window shaped yoke [U.S. Patent Publication No. 2008/0078956; U.S. Pat. No. 7,528,390]; and the White & Chen ribbon ion beam systems described in U.S. Pat. Nos. 7,326,941 and 7,902,527 and their Continuation applications, all of which utilize a form of magnet described in U.S. Pat. No. 7,112,789.

As described in U.S. Pat. No. 7,528,390, the Satoh apparatus uses a window-frame magnet incorporating two pairs of coils, each of which can be separately excited to control deflection in two orthogonal directions. If this equipment were enlarged to permit the passage of a substantially larger ribbon beam, the number of ampere turns required would grow in direct proportion to the beam major transverse dimension—which is counter to the goals expressed for the present invention. Thus, the Satoh apparatus cannot and does not fulfill the present need.

Similarly, the apparatus described by White & Chen in U.S. Pat. Nos. 7,326,941 and 7,902,527 and which utilizes a form of magnet described in U.S. Pat. No. 7,112,789, would suffer from the same shortcoming: That any increase in beam size requires a proportionate increase in ampere turns. The true increases in power requirement and equipment weight would grow at a faster rate than this because increased cross sections of steel are required to contain the ever-increasing stray magnetic field(s) emanating from such larger devices.

All such devices in which the principal magnetic field component is aligned with the major transverse dimension of the ion beam must exhibit the twin downsides of increasing ampere turns in proportion to the beam dimension and increasing stray magnetic field(s).

Other magnetic devices used within the Chen & White apparatus (based upon U.S. Pat. Nos. 7,105,839; 7,078,713; and 8,035,087 for focusing and controlling uniformity and direction of the ion beams), can be scaled upwards for larger sized ion beams because their magnetic fields are not aligned with the beam's major transverse direction—but they are not capable of separating beams of different mass, nor of providing a scalable one-dimensional focusing ability in a direction transverse to a ribbon ion beam without providing an overwhelming unwanted defocusing effect along the major dimension. This was not their intended usage, and is beyond their structural and functional capabilities.

B. Others working in this technical field have used alternative models for focusing and controlling uniformity and direction of traveling ion beams. Merely illustrating and representing some of these other attempts to achieve this goal are: The Aitken approach [14th International Conference on Ion Implantation Technology, 2002, IEEE, pages 448-451] who presented one conceptual model for making such a device based upon a sextupole magnet; and the Benveniste et al. conceptual model (U.S. Patent Publication No. 2010/0116983) which introduced the structural design of and requirement for a closed frame of multiple solenoid coils yoked together in parallel. A summary review for each of these alternative models is presented below.

(i) The Aitken approach has been described in meaningful detail above and is illustrated by Prior Art FIGS. 2a, 2b, and 2c respectively. Aitken utilizes the focusing available in rising and falling transverse magnetic fields as described by Enge and Banford (cited above), while shearing the ribbon-shaped ion beam through the maximum amount possible without sending the beam back the way it had come (see FIG. 2a); and generates a very abrupt internal focus, which may itself degrade the beam. Also, it should be noted that the Aitken diagrams have their scale greatly exaggerated in the beam narrow dimension, and the Aitken originated figure only indicates an ability to accept a beam with a full angular spread of about 1 degree.

On this factual basis, and especially because the Aitken device operates on the verge of completely turning the beam around, 3rd-order aberrations would seriously degrade beam transmission if more realistic beam angles were considered—a truly realistic beam angle typically being a full angle of 4 degrees in the beam narrow dimension. Thus, while the Aitken approach can be extended to an arbitrary degree in the transverse direction without increasing the ampere-turns requirement, the model system nevertheless operates in a manner requiring very small beam dimensions and beam angle spreads; is substantially more complex and heavy in construction; and requires multiple coils and power supplies.

(ii) The Benveniste et al. approach and model system passes the ion beam through a pair of solenoid coils; and steel yokes are employed to concentrate the magnetic flux within the beam. It is noteworthy that the solenoid coils themselves are not circular in shape; rather, the solenoid coils are elongated to match the shape of the ribbon beam.

Solenoid coils have long been used for focusing electron beams, and are well known in cathode-ray tubes and electron microscopes. Furthermore, it is well known to use a pair of opposing solenoids to achieve focusing without rotating the beam—indeed, this pairing is critical to achieving high resolution. But the application of solenoid coils to a high aspect ratio ribbon-shaped ion beam is a recent event; and, as described earlier herein in the context of the IBIS ion implanter, rotation of the beam is morphed into a shearing effect. Invariably therefore, the solenoid field must introduce angular momentum to the beam, according to Busch's theorem; and hence, the Benveniste et al. approach and model system uses an opposed pair of solenoids to restore the unrotated state to the traveling ion beam.

The Benveniste et al. invention addresses a number of the beam's needs identified above herein, but the disclosed approach and model system differs substantially in many of its key features and also fails to address certain requirements or true needs. Most notable among these differences and deficiencies are the following:

(a) The Benveniste et al. approach requires passing the ion beam through the spatial volume of the aperture of each solenoid coil in an aligned pair of solenoid coils held in tandem. Specifically, Benveniste et al. states " . . . Each of the solenoid coils have a racetrack configuration defining a space through which the ion beam travels . . . "

(b) Because each of the paired solenoid coils in the Benveniste et al. device individually must fully encircle the ion beam, and a vacuum chamber must contain and house the traveling ion beam, disassembly of the Benveniste et al. device is impossible without concomitant disassembly of the vacuum system itself.

(c) The Benveniste et al. system cannot be readily combined with other devices, such as an apparatus for controlling the uniformity of the ion beam, because the paired solenoid coil configuration precludes the introduction of other multipole windings for applying orthogonal fields to the same volume through which the ion beam travels.

(d) The Benveniste et al. system does not include and does not allow the generation of magnetic fields using permanent magnets.

Consequently in today's technology, it is highly desirable to find an effective means for separating a variety of unwanted ion species from a traveling ribbon-shaped ion beam in which the size of the travel passage for the beam in its major dimension can be extended to an arbitrary degree; and where there is no need to apply a magnetic field aligned with this major dimension. To this may be added: Ease of disassembly and service; ability to combine uniformity tuning (as described in the cited White and Chen patents) with the focusing and mass selection functions; and the ability to use permanent magnets to reduce power requirements.

SUMMARY OF THE INVENTION

The present invention has multiple aspects.

A first aspect is an apparatus suitable for focusing a traveling charged particle beam which will transversely pass adjacent to and over it, the beam direction being substantially the z-direction in a Cartesian coordinate system, said apparatus comprising:

a substantially E-shaped block mounting formed of ferromagnetic material whose exposed face presents a plurality of discrete and spatially distanced parallel raised ridges and a plurality of interposed and spatially distanced parallel recessed channels, wherein said E-shaped magnetic block ($\alpha$) dimensionally extends in the x-axis direction for a distance greater than the x-axis size of the traveling charged particle beam which will pass it at a close distance, and ($\beta$) said spatially distanced parallel raised ridges and said interposed and spatially distanced parallel recessed channels lie perpendicular to the direction of travel for the charged particle beam; and magnetic field generating means which are transversely fitted into the structure of and are disposed in an x-z plane of said E-shaped block mounting, the magnetic field generated by said means extending perpendicularly in the y-direction from the exposed face of said E-shaped block mounting.

A second aspect provides an assembly for focusing a traveling charged particle beam which will transversely pass through it, said assembly comprising:

a matched pair of oppositely disposed and aligned preformed focusing articles set spatially apart from each other at a fixed gap distance, and wherein the traveling charged particle beam will transversely pass in the z-direction through the spatial volume of said fixed gap distance between said matched pair of oppositely disposed articles, wherein each said article of said matched pair comprises a substantially E-shaped block mounting formed of ferromagnetic material and wherein the exposed block face presents at least three discrete and spatially distanced parallel raised ridges and at least two interposed and spatially distanced parallel recessed channels, and wherein said E-shaped block mounting ($\alpha$) dimensionally extends in the x-axis direction for a distance greater than the x-axis size of the traveling charged particle beam which will pass near a z-x plane over it, and ($\beta$) said three spatially distanced parallel raised ridges and said two interposed and spatially distanced parallel recessed channels lie perpendicular to the direction of travel of the charged particle beam, and magnetic field generating means which are transversely fitted into the structure of and are disposed in an x-z plane of said E-shaped block mounting, the magnetic field generated by said means extending perpendicularly from the exposed face of said E-shaped block mounting; and means for directing a traveling charged particle beam to pass transversely through said fixed gap distance existing between said exposed face of each E-shaped block mounting in said oppositely disposed article pair.

BRIEF DESCRIPTION OF THE FIGURES

The present invention may be more easily understood and better appreciated when taken in conjunction with the accompanying Drawings, in which:

Prior Art FIG. 1a shows a conventionally known magnetic quadrupole lens;

Prior Art FIG. 1b shows a triplet of such lenses through which an ion beam containing multiple species is passed off-center.

Prior Art

Prior Art FIG. 2b illustrates a side view of the strong focusing that accompanies the shearing effect shown in Prior Art FIG. 2a;

Prior Art FIG. 2c shows the travel paths of beams of ions having different magnetic rigidities.

DETAILED DESCRIPTION OF THE PRESENT INVENTION

The present invention is an apparatus and multi-unit assembly which is able to achieve two different and highly desirable functions: (i) A focusing of a charged particle beam; and (ii) a mass separation of desired ion species from unwanted ion species in traveling ion beams. The apparatus is a simply organized and easily manufactured article; is relatively light-weight and less expensive to make; and is easier to install, align, service, and operate than conventionally available devices. Furthermore, it is easy to combine the focusing and mass separation capabilities of the present invention with additional magnetic functions, such as control of beam uniformity, by the addition of orthogonal coils.

Attention is directed to the fact that in some particular commercial applications, the operating systems of the ion implanter are required to separate up to 50 keV $P^+$ from undesired $P^{++}$ and from $P_2^+$ ions, as well as from certain other ion contaminants; and it is often also necessary to separate $B^+$ from undesired $B^{++}$, $F^+$, and $F^{++}$ ions. This last operational requirement often is the most stringent for any ion implantation system. Consequently, efficient coupling of such an unique mass analyzer device to a high-current planar ion source would have great benefits and major advantages for ion implantation of large substrates, such as flat-panel displays and solar cells—particularly if the additional function of controlling beam uniformity could be provided within the same space.

The Apparatus and its Operational Circumstances

The unforeseen features and distinctive differences existing in each embodiment and alternative format of the present invention may be best understood by considering a traditional ion implantation system in which a ribbon-shaped ion beam is traveling in a vacuum chamber (or other vacuum environment) along the z-axis direction.

In these conventional operating circumstances, the major transverse dimension of the ribbon-shaped ion beam is in the x-axis direction, and its minor dimension is in the y-axis direction. In addition, the traveling ribbon-shaped charged particle beam contains at least one desired species of ion, accelerated to a desired energy, as well as various unwanted ion impurities.

Also in this conventional operational system, at least one structural apparatus or multi-unit assembly is desirably present to focus the traveling ion beam, and/or to separate a desired ion species from unwanted ion species in the charged particle beam. In order to achieve either or both of these desirable goals, one typical embodiment of the essential E-block-coil apparatus comprising the present invention is illustrated by FIG. 3.

The E-Block-Coil Combination Unit

Figure 2A:
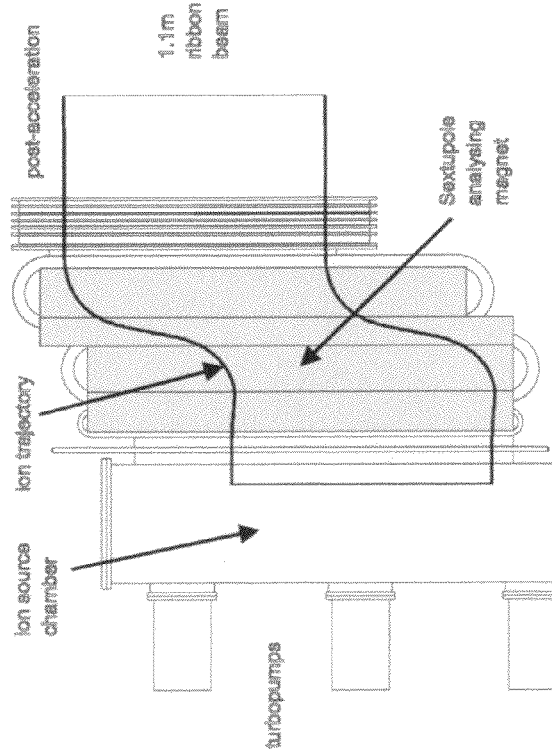
FIG. 2a illustrates the Aitken 2002 apparatus, which shears a travelling ribbon-shaped ion beam first in one direction and then in the other direction.
Figure 2B:
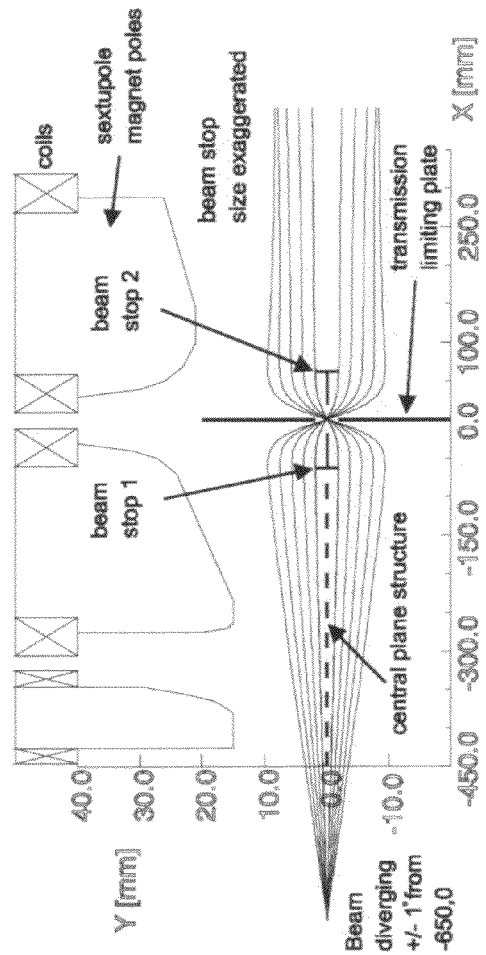
Figure 3:
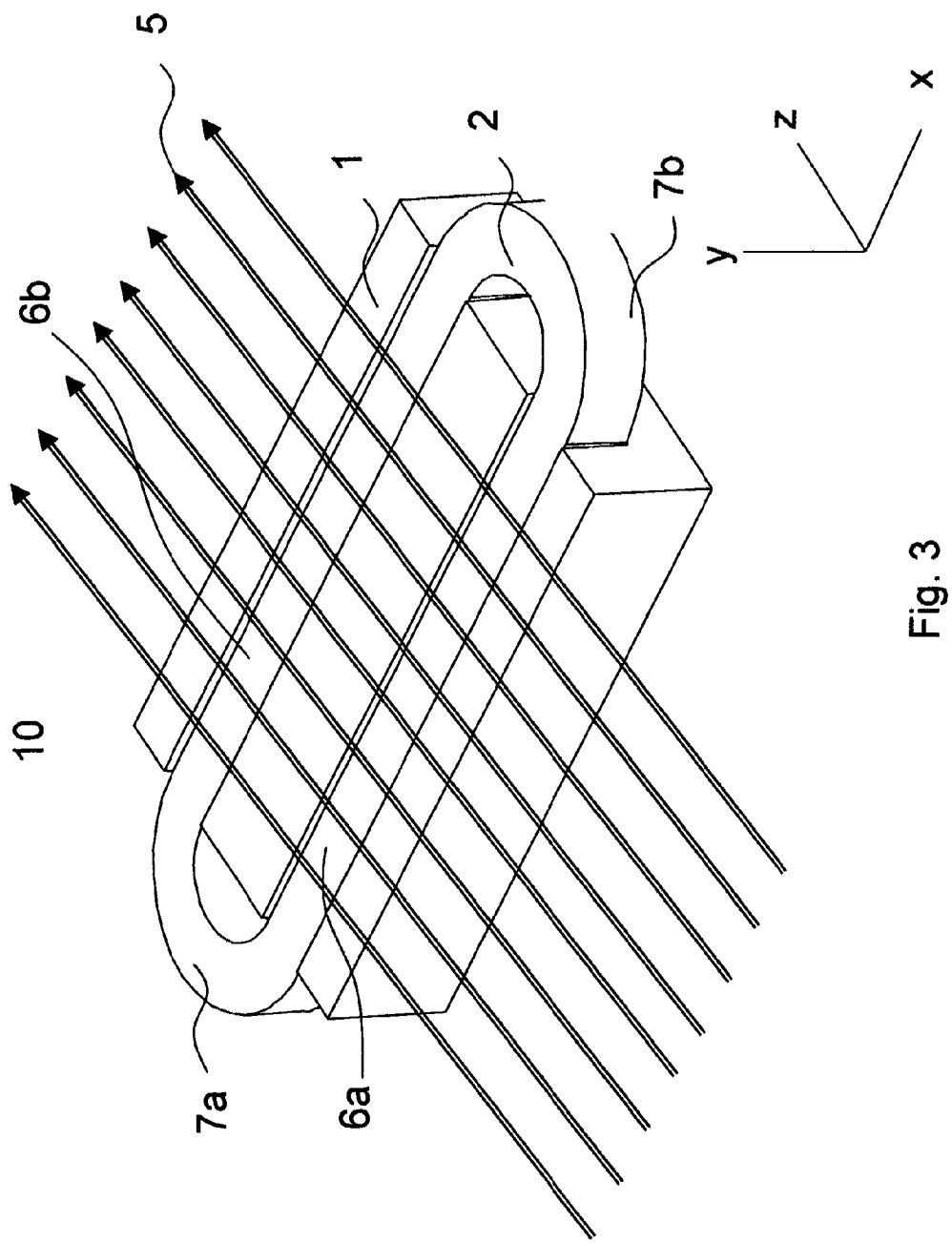
FIG. 3 shows an article identified as Apparatus Version 1 comprising the present invention.

As seen in FIG. 3, the complete structural article of manufacture (needing only a conventional source of electrical power) is an E-block-coil combination 10 comprising a substantially E-shaped block mounting 1 and an obround-shaped closed coil 2. Each of these structural components is described in marked detail below.

Initially however, it is believed useful here to identify some of the more unusual operational attributes and distinctive features presented by the unitary E-block-coil combination.

(α) The operational unit is not a solenoid coil device as such—i.e., it does not encircle the volume in which it is desired to generate and apply a magnetic field. There are no solenoid coils in any embodiment or format of the E-block-coil combination.

(β) The unitary E-block-coil combination presents an exposed face which generates an orthogonally extending and adjustable magnetic field of limited breadth; and the orthogonally extending magnetic field of limited breadth is the collective result of a series of contiguous magnetic fields of spatially alternating polarity; and the strength of the orthogonally extending contiguous magnetic field of alternating polarity can be altered at will by varying the electrical current in the coil.

(δ) The traveling charged particle beam undergoing focusing or ion separation does not at any time pass through any coil structure nor any multiple-coil arrangement which may be present in any embodiment or format of the E-block-coil combination. To the contrary, the travel pathways of the charged particle beam are always transverse to the exposed face of the E-block-coil combination and lie bounded by a pair of z-x planes adjacent and parallel to—but clearly separated from—the exposed face, and thus the entire exterior surface, of the E-block combination.

The E-Block Mounting

Specifically, the E-block mounting 1:

(i) Is a discrete article of predetermined size and dimensions having an exposed block face as its forward aspect and a flat exterior surface as its rearward aspect;

(ii) Is made of ferromagnetic material—i.e., iron or any other magnetic metal or metallic alloy blending;

(iii) Has a cross-sectional form and an exposed block face whose frontal visual appearance substantially resembles the letter 'E' wherein two recessed spatial channels 12, 14 lie in parallel and are defined in their volume and channel dimensions by three different and spatially separated bar-like members or raised ridges 13, 15 and 17 which also lie in parallel with each other; and (iv) Is a preformed construct which extends in the x-axis direction over a linear distance greater than the x-dimension extent of the traveling charged particle beam which will pass generally in the z-direction as a sheet over the exposed face (and exterior surface) of the E-block mounting.

The Obround-Shaped Closed Coil

Also as shown by FIG. 3, the obround coil 2 is a single, substantially racetrack-shaped, wire winding made from a continuous length of electrically conductive material; and appears as a closed loop-like entity which comprises two parallel straight length sections, each straight length section being greater in extent than the x-axis dimension of the charged particle beam, as well as two curved ends each bending through 180 degrees.

As employed herein, the word "obround" correctly identifies and properly describes the desired shape of the closed coil 2; and the term "obround" as used herein is defined as a closed geometric configuration whose fixed perimeter has parallel straight sides [such as linear side sections 6a and 6b respectively in FIG. 3] and substantially semicircular ends [such as curved end sections 7a and 7b respectively in FIG. 3]. A typical format thus is a fixed configuration formed of two semicircles connected by parallel lines tangent to their endpoints. The important feature of this configuration is that the perimeter of the obround-shaped structure demonstrably has parallel side sections; however, there is no strict requirement that the end sections be truly semicircular as such. Thus for example, the two coil ends of the obround configuration could each be formed of two circular quadrants and a short straight section, or be any other topologically similar construction which bends through 180 degrees and structurally joins with the two straight parallel side sections to form a closed loop-like perimeter.

Moreover, it will be recognized and understood that the particular shape of the closed coil is expected and intended to be somewhat varied in precise configuration in order to meet individual manufacturing standards and/or individual use circumstances. However a primary goal is the elimination of any significant variation of the magnetic field strength or shape as a function of the x-coordinate, over the extent of the ion beam.

Attention is also particularly directed to the proper positioning of the obround-shaped closed coil 2—which is always and invariably transverse with and lies in the x-z plane of the E-block mounting at a predetermined y-coordinate—and is thus unique in its placement. The properly positioned closed coil 2 is transversely fitted adjacent to and around the centermost raised ridge 15, and rests entirely within the spatial volume provided by the pair of parallel recessed channels 12, 14 in the E-block mounting 1. Such a transverse fitting and placement of the closed coil 2, resting around the centermost raised ridge 15 in the z-x plane of the E-block mounting, occupies the spatial volume of both recessed channels 12, 14 simultaneously; and the closed coil is supported in such transverse positioning parallel to the z-x plane by the two outermost bar-like members or raised ridges 13 and 17 respectively.

Also, in the particular embodiment shown by FIG. 3, the transversely placed closed coil 2 fully occupies the entirely of the available channel space and volume provided by the pair of parallel recessed channels 12, 14 in the E-block mounting. However, this full occupancy will not always be true; and, in certain format instances, more than one obround-shaped closed coil can concurrently occupy the available channel space and volume provided by the pair of parallel recessed channels 12, 14 in the E-block mounting, as illustrated by the alternative embodiment shown in FIG. 4b.

The Orthogonally Extending Magnetic Field

A variable electric current is provided and passed to the E-block-coil combination 10 by any conventional and controllable means through the obround-shaped coil 2, whereby an orthogonally extending magnetic field is generated which not only encircles the conductive material of the coil, but also is shaped by the ferromagnetic composition of the three different and spatially separated raised ridges 13, 15 and 17; and becomes concentrated in space generally near the two exposed surfaces of the straight sections of the closed coil 2. Different portions of the ferromagnetic structure in the E-block mounting 1 become 'North' and 'South' magnetized poles, depending on the current direction.

Thus, in one current direction, the exposed face of the centermost raised ridge 15 becomes magnetized as a South pole (S), while the outermost located raised ridges 13 and 17 each become magnetized as North poles (N). In this manner, the exposed face of the E-block-coil combination as a whole presents a "N-S-N" series of discrete magnetized poles. However, with the current flowing in the other direction, these polarities are reversed and the exposed face of the E-block-coil combination as a whole presents the magnetized pole reversed series "S-N-S".

Given the flow of electrical energy of an appropriate current, each of the three adjacently positioned and energized magnetized poles independently generates an orthogonally extending magnetic field of limited breadth; and the plurality of adjacently extending magnetic fields of limited breadth collectively form a contiguous magnetic field of alternating polarity; and the strength of the orthogonally extending contiguous magnetic field of alternating polarity can be altered at will by varying the electrical current to yield on-demand adjustable and controllable magnetic field over the exposed face of the E-block-coil combination.

An Optional Alternative Structural Format

It will be further appreciated that, as an optional alternative to and substitute for the use of a closed coil 2 as shown in FIG. 3, a permanent magnet or plurality of permanent magnets may be introduced into the E-block mounting structure—typically by replacing part of the ferromagnetic metal or alloy material forming the construct.

In such alternative formats, one of the simplest procedures is to replace the middle raised ridge or centrally located bar-like member of the E-block mounting with a similarly shaped raised ridge formed of permanent magnet material, which will lie with its direction of magnetization along the y-axis of the E-block structural design. Thus, as with the true closed coil formats shown in FIG. 3, this permanent magnet (or plurality of permanent magnets) becomes transversely integrated into the E-block mounting structure; and similarly lies transversely positioned in a z-x plane with respect to the two outermost located bar-like members, the raised ridges 13 and 17 respectively [in FIG. 3].

It will be recognized also that there are a wide range and variety of different transverse placements and orientations possible when using such permanent magnet alternatives which produce equivalent N-S-N or S-N-S pole magnetizations.

Ampere's Law states that $\oint H.dl=nI$, where the integral of magnetic field "H" is taken over any closed path encircling n conductors carrying current "I". Consider a magnetic probe mapping the magnetic field, the probe passing along the travel pathway of a beam ion moving in the z-axis through the field of the present invention, then having passed the entire path of the ion, the probe completes a looped path well outside the magnetic field of the device, and return to the starting point. If the magnetic field along the beam's pathway is integrated, using this conceptual method, it is most desirable that the integrated field be zero in value, as this will mean that there is zero net shearing of the ion beam passing through the device. Busch's theorem relates the canonical angular momentum imparted to an ion beam to the change in the axial magnetic field. Thus, by ensuring that the axial magnetic field integrates to zero in passing through the working region of the device, one also ensures a zero net shearing of the beam.

Accordingly, if no current is permitted to encircle the beam, the device will impart zero net shearing, and zero net angular momentum, to the ion beam.

It follows that the use of permanent magnets in these alternative structural formats is possible because the integrated magnetic field along the z-axis defined by the E-block mounting is intended to be zero in value, which allows the requirement that $\oint H.dl=0$ to be met. In general, it is impossible to produce equivalent magnetic fields with permanent magnets compared to those from solenoids—because with a solenoid, $\oint H.dl=nI$ taken along the axis is consistently a non-zero value. In marked contrast however, in the present invention, the integrated field along the beam's travel axis is always zero in value. It is noted also that, in either case, there are local fields along the z-axis; but with the present invention, these local fields are symmetric and integrate to zero in passing completely along the z-axis.

Consequently, the unusual presence and use of permanent magnets in these alternative structural formats—as well as the deployment and use of an obround-shaped closed coil which is transversely fitted into with and lies in a z-x plane of the E-block mounting—constitute different forms of magnetic field generating means which are transversely positioned into and become an integrated part of the overall structure disposed cross-wise in a horizontal plane of the analyzer apparatus.

III. The Various Alternative Embodiments of the Invention

The present invention may be prepared in a range of different assemblies and structured in a variety of different embodiments. The range and variety of these embodiments is merely represented by Apparatus Versions 1-6 respectively, as described below.

Apparatus Version 1

The E-block-coil combination 10 comprising an E-block mounting 1 and a closed obround-shaped coil 2 as described in detail above and illustrated by FIG. 3 is in fact Apparatus Version 1 of the invention. Most notably, this embodiment constitutes the most basic unit and simplest operational mass analyzer unit of the present invention. In effect therefore, all other versions and embodiments of the mass analyzer apparatus utilize and build upon the essential features and specified construction of Apparatus Version 1.

Moreover, as regards the proper intended usage of Apparatus Version 1 of the present invention, it is critical to recognize and appreciate that the E-block-coil combination construct 10 as described above is always carefully and intentionally to be placed in a z-x plane which is parallel and adjacent to the travel pathway of the ribbon-shaped ion beam 5 which will pass it. Thus, the E-block-coil combination 10 will not at any time ever completely surround—and thus cannot ever fully encircle as such—the traveling ribbon-shaped ion beam.

Accordingly, when a current (of known magnitude) is passed through the E-block-coil combination construct 10, the travel path of the ion beam is limited and controlled such that the ions of the beam transversely pass through the regions of magnetic field then extending from the magnetized poles of the E-block-coil combination construct 10. The straight coil sections of the E-block-coil combination lie in a z-x plane at a predetermined y-coordinate, and the beam's z-axis is unobstructed over the entire distance of its travel path. This operational arrangement is clearly indicated by the travel arrows appearing in FIG. 3.

Thus, with current passing in a particular direction in the closed obround-shaped coil (having one polarity), the traveling ion beam will be deflected through a small angle in the +x-direction on approaching the device; and be deflected in the −x direction on passing the center of the device; and will again be deflected in the +x direction upon leaving the mass analyzer apparatus.

The net deflections in the x-direction are small, and may be arranged to sum to zero. However, it has also been found that there is a net deflection in the y-direction away from the coil—this deflection becoming weaker, the greater the distance of a given beam trajectory from the coil. The cause of this deflection is discussed below.

The deflections in the y-direction are smaller than those in the x-direction. The magnitude of this y-direction deflection is proportional to the square of the current in the coil. It is always directed away from the coil, and as a result, unlike the x-deflection, does not sum to zero as the beam passes the device, but persists.

For these reasons, the beam is focused only in the y-direction, and there is no focusing at all in the x-direction. It can be arranged that there is also no net deflection in the x-direction; details are given below.

The amount of deflection, since it is caused by a magnetic field, is proportional to the charge of the ions; and is inversely proportional to the square root of the mass and of the energy of the ions in the beam. But the focusing effect is proportional to the product of the deflection and the force on the ions, and therefore is inversely proportional to the mass.

On this rationale and structural basis, if one places stops adjacent to the desired beam path, one or more unwanted ion species (contaminants) can be meaningfully separated from the desired or required ion species. However, it is particularly important in these circumstances of use to block the paths of ions passing at too great a distance from the closed coil and ferromagnetic E-block mounting, where the field is weaker and the y-deflection and focusing are consequently less.

Apparatus Version 2

Figure 4A:
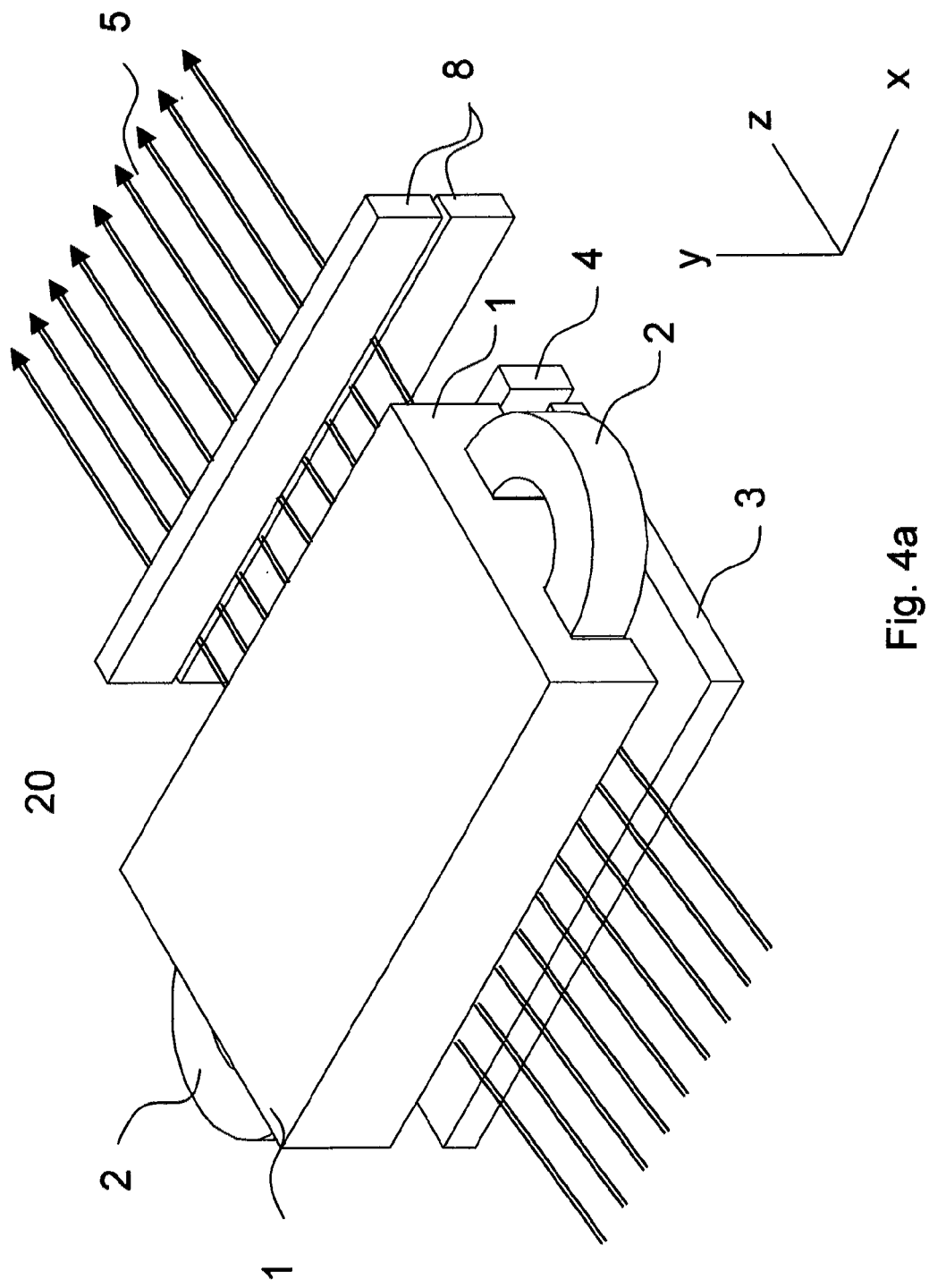
FIG. 4a shows a beam mass analyzer assembly identified as Apparatus Version 2 comprising an E-block-coil combination, boundary plate, beam stop and resolving aperture.

A second embodiment of an operational assembly which utilizes the basic apparatus described above in combination with a flat ferromagnetic plate 3 is shown by FIG. 4a. The ferromagnetic plate 3 lies in and similarly defines a z-x plane at coordinate y=0.

In this embodiment, there is a fixed gap distance of predetermined size separating the exposed face of the flat ferromagnetic plate 3 from the exposed face of the E-block-coil combination which is located at a coordinate of $y=y_1$; and the traveling charged particle beam transversely passes over the length of this fixed gap distance and through the extended magnetic field present therein.

The extended magnetic field (generated by the E-block-coil combination) is effectively terminated on this ferromagnetic plate 3 at right angles to its internal exposed surface or face. In the plane y=0, there are essentially no magnetic field components in the x- or z-direction. However, at non-zero y coordinates, these components will appear.

As before, the traveling ion beam will be deflected through a small angle in the +x-direction on approaching the device; and be deflected in the −x direction on passing the center of the device; and will again be deflected in the +x direction upon leaving the mass analyzer apparatus (or vice versa). The y-deflection mentioned above arises from the components $v_x$ of ion motion in the x-direction so induced.

In addition, in the regions of changing magnetic field there is a component of magnetic field in the z-direction $B_z$ proportional to the y-coordinate, which arises because the magnetic field varies with the z-coordinate. The product of $B_z$ and $v_x$ multiplied by the ionic charge gives the force in the (negative) y-direction, yielding a y-deflection.

In the fixed gap $0<y<y_1$ bounded by the ferromagnetic plate 3 and the exposed face of the E-block mounting 1, the y-deflection of the ions is proportional to their distance from the ferromagnetic plate. FIG. 4a shows the placement of a beam stop 4 and an aperture containing barrier 8, which are so positioned as to transmit only certain ion species.

Figure 4B:
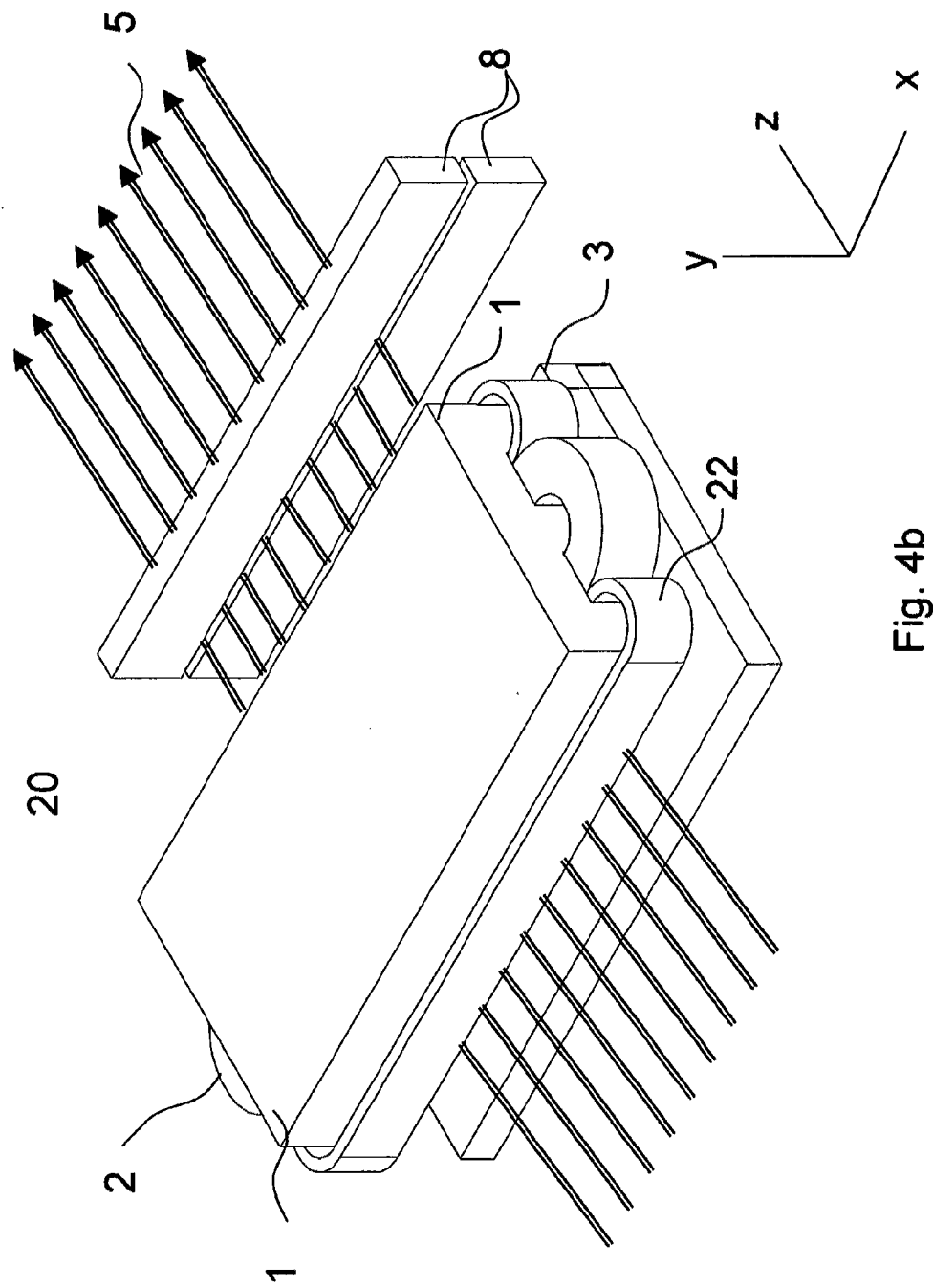
FIG. 4b shows the same apparatus of FIG. 4a with an added pair of coils to permit x-deflection to be adjusted precisely to zero.

In addition, Apparatus Version 2 structurally allows for the optional inclusion of one or more additional obround-shaped closed coils 22 of small cross-section size to be transversely positioned in a z-x plane) around each of the two outermost bar-like members or raised ridges 13 and 17 of the E-block mounting, as shown in FIG. 4b. As seen therein, each of the additional obround-shaped closed coils 22 is disposed transversely within and shares the available channel space and volume provided by the pair of parallel recessed channels 12, 14 in the E-block mounting with the extending sides of the obround-shaped closed coil 2. Thus, in this multiple closed coil disposition, the transversely placed central closed coil 2 and each of the transversely positioned and outermost located additional closed coils 22 concurrently occupy the available channel space and volume of the parallel recessed channels 12, 14 in the E-block mounting 1.

It will be appreciated that this pair of transversely placed and outermost located additional obround-shaped closed coils 22 is optionally present as the structural means by which to create (and/or to maintain) a zero value net deflection in the x-direction (by adjusting the current strength and direction in coils 22), which is the net sum of the positive deflection at the entrance and exit sites, plus the negative deflection from the central pole. It is recognized that the net deflection may have a non-zero value unless the magnetic field in the central region of the apparatus is well balanced using such additional obround-shaped closed coils 22 or via other equivalent arrangements which allow the net x-deflection to be precisely compensated—as for example, a single thin larger rectangular coil encircling the items 1 and 2.

Apparatus Version 3

Figure 5:
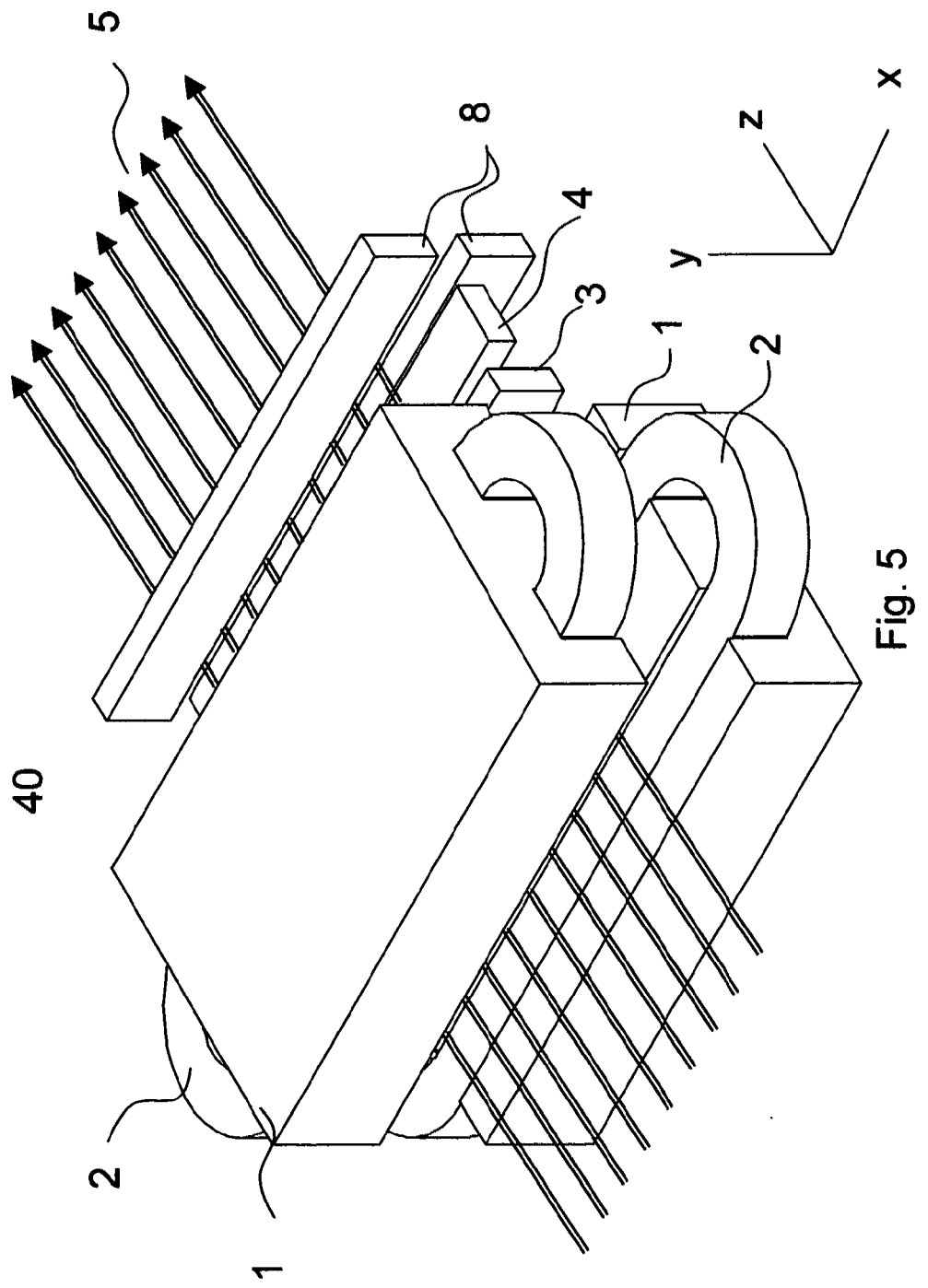
FIG. 5 shows a beam mass analyzer assembly identified as Apparatus Version 3 comprising a pair of facing E-block-coil articles, beam stops, and a resolving aperture.

A third alternative assembly comprises two discrete and identically constructed E-block coil combinations which are placed together in parallel and lie opposite each other in paired tandem such that the traveling ion beam pathways pass transversely between them, as is shown by FIG. 5. The two individual coils 2, each of which is fixed in its own E-block mounting in this assembly, are excited with identical currents in the same direction such that the magnetic field extends from the magnetized poles of one E-block mounting to the opposing poles on the other.

It is interesting that the assembly of Apparatus Version 3 will function whether opposing poles have the same or opposing polarity; but for descriptive purposes, one presumes that the opposing poles will have an opposite polarity—which requires that the current in the two coils be flowing in the same direction around the y-axis. However the derivation of the focusing effect will be different for the case where the currents are opposing.

This Apparatus Version 3 construct may be used with a single traveling beam close to one coil/block structure; or by two individual and almost parallel traveling ribbon-beams, one beam passing adjacent and near to each of the coil-block structures. The two E-block-coil combinations—although never in physical juncture or direct contact—magnetically attract each other across the gap distance through which the traveling beam(s) pass.

Figure 9A:
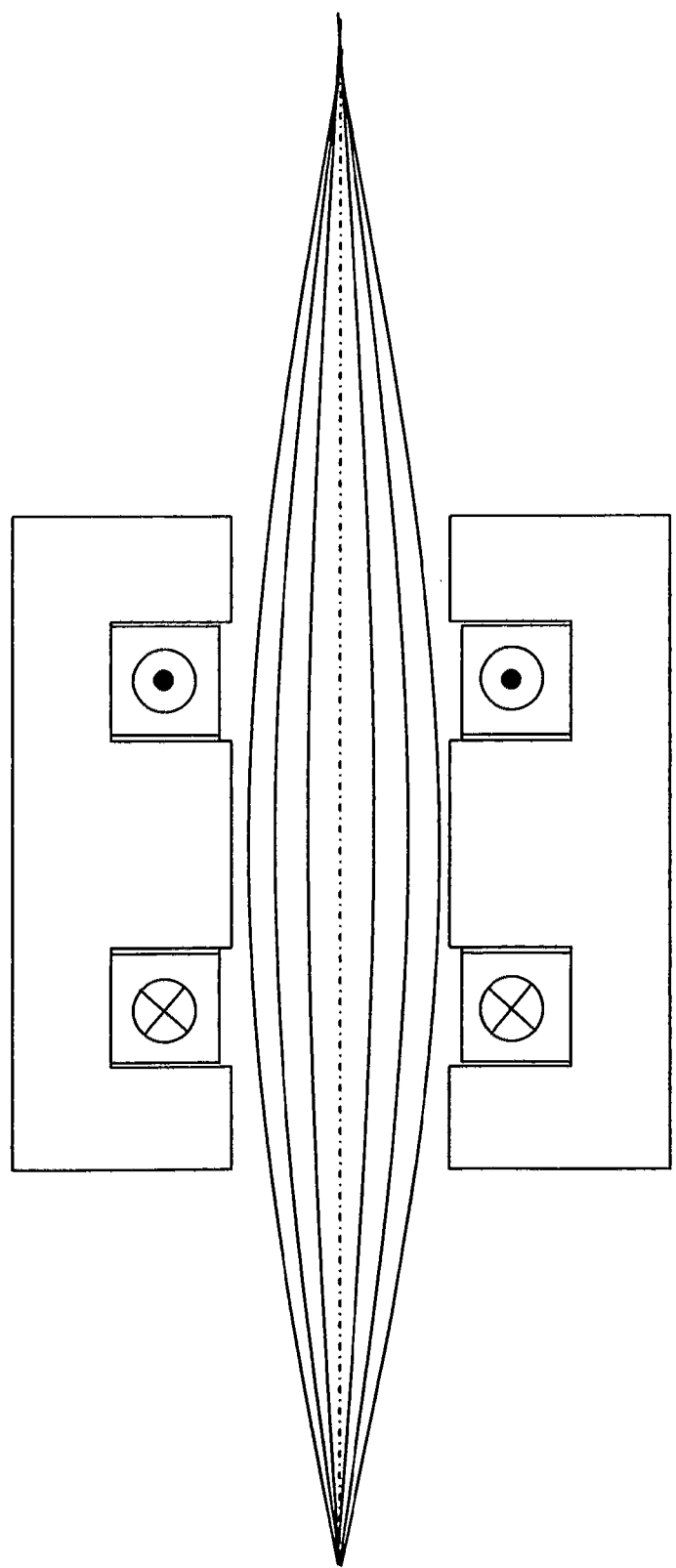
FIG. 9a shows an Apparatus Version 3 embodiment in cross section as a focusing device.
Figure 9B:
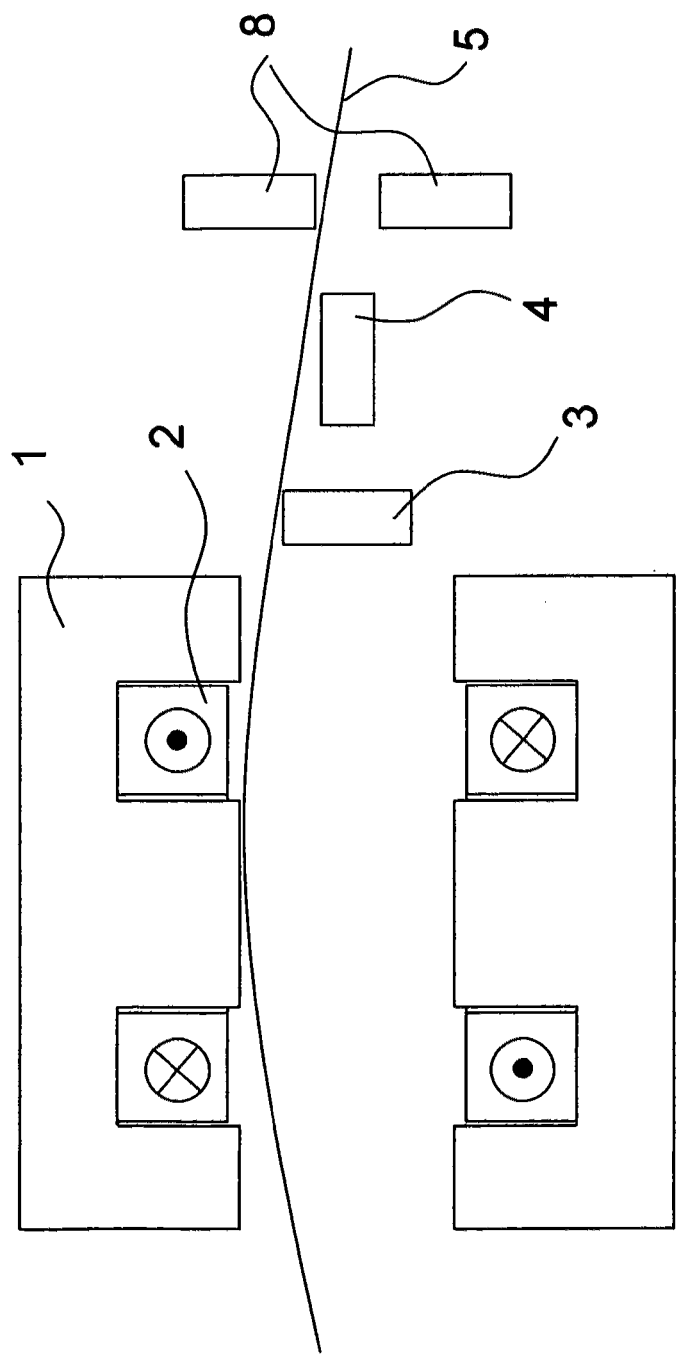
FIG. 9b shows an Apparatus Version 4 embodiment as a mass selection device.

It is particularly noted also that: If the Apparatus Version 3 construct is to be used for focusing (as shown in FIG. 9a), then no beam stops need be used. Alternatively, if the construct is to be used for mass selection [as shown in FIG. 9b, but disregarding for the moment the direction of current flow in the coils—see explanation below], it is essential that the pathway through the center be blocked at some point, as shown by beam stops 3 and/or 4 in FIG. 5. Ions allowed to pass close to the midplane would experience almost no y-directed deflection, and for such ions, separation from contaminants would thus be impossible.

It will be also recognized that the magnetic field shape provided by Apparatus Version 2 described above is essentially the same as the shape of the magnetic field existing in one half of the assembly of Apparatus Version 3, as can be seen by symmetry. Magnetic field lines can enter or exit free space normal to the surface of a ferromagnetic plate (unless it is nearing saturation); thus, the plate provides a boundary equivalent to the plane of symmetry of Apparatus Version 3. Moreover, the additional trim coils 22 could also usefully be added to Apparatus Version 3.

Apparatus Version 4

A fourth embodiment of the invention is very much like that of Apparatus Version 3 as described above—except that the current in one of the coils is reversed, and thus the individual currents in the two discrete coils are opposed in charge/polarity. In this Apparatus Version 4, therefore, the most notable feature is that the two discrete E-block-coil combinations are oppositely magnetized and repel each other.

Figure 6A:
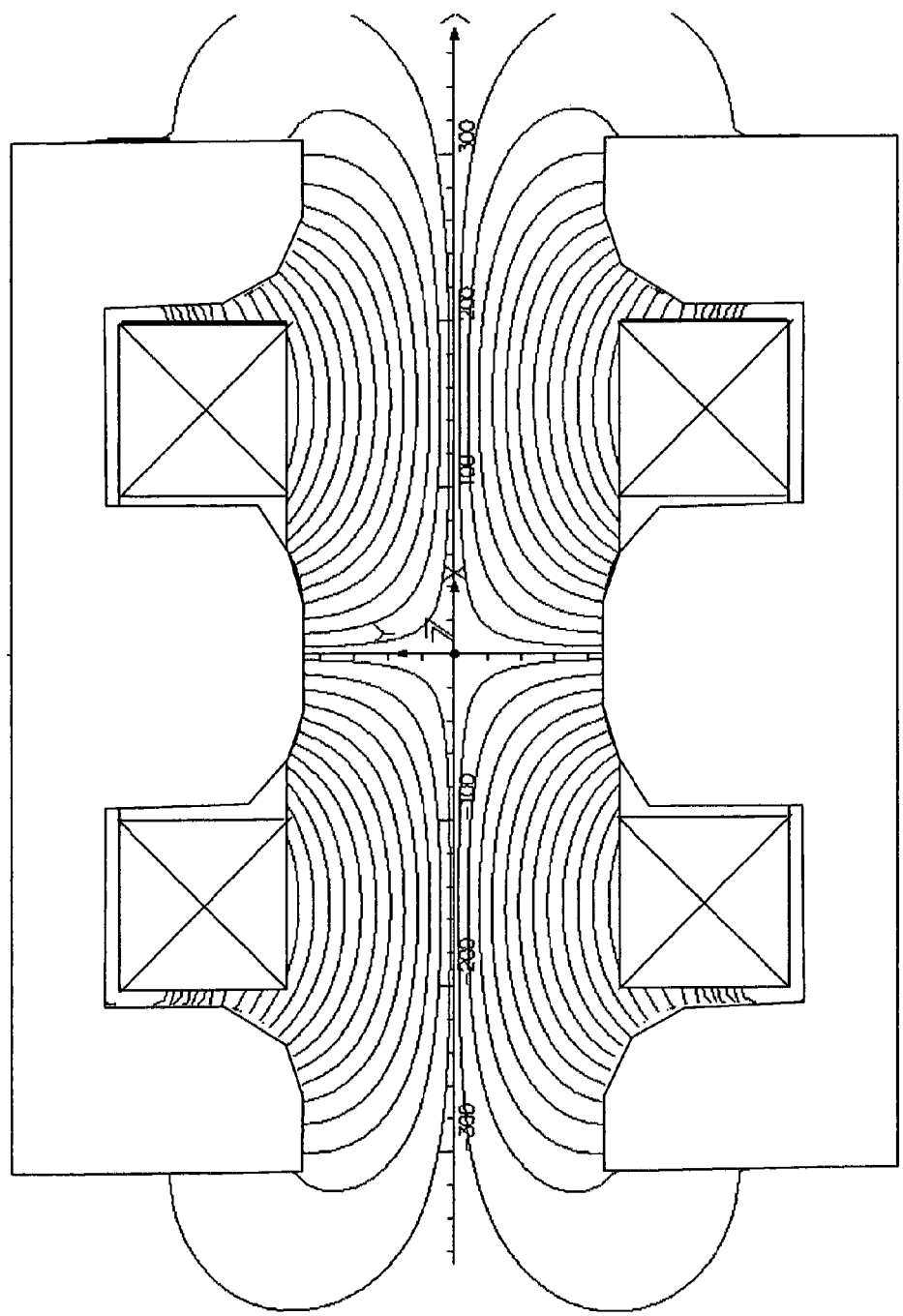
FIG. 6a shows the magnetic flux lines in a cross section of Apparatus Version 4.
Figure 6B:
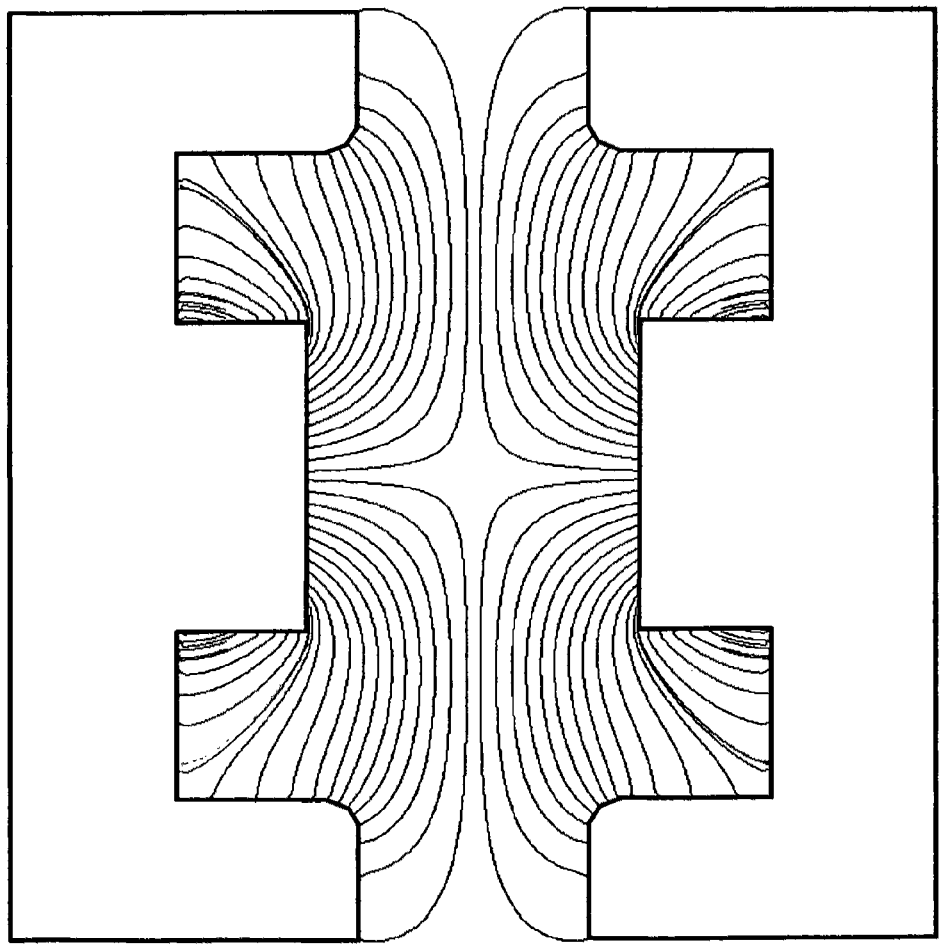
FIG. 6b shows the magnetic flux lines in a cross section of version 5, which uses permanent magnets and no coils.

In evidence of this feature, FIG. 6 plots the field lines in this geometry; and the external fields are minimized in this geometry. This configuration is preferred for both performance and ease of analysis; as well as for the straight lengths of conductor which are arranged so that, in cross section, they are centered on the apexes of a rectangle. The direction of current alternates as one moves around the rectangle as shown in FIG. 9b, in contrast to the different current flow shown in FIG. 9a.

There is also a difference in the origin of the y-focusing in this arrangement. In Apparatus Versions 2 and 3 respectively, the z-component of magnetic field is zero at the symmetry plane, but the component $v_x$ of transverse ion motion is essentially constant across the whole beam thickness at a given z-coordinate.

However in Apparatus Version 4, the situation is changed: it is the $v_x$ motion which now varies with the y-coordinate, and the z-component of magnetic field is substantially uniform across the beam width at a given z-coordinate (but not entirely so). The effect on the y motion, however, is very similar.

Most importantly and distinctively, in none of these structured assemblies and alternative arrangements does the ion beam pass through a coil. This conventionally occurring construction and event—passage of the ion beam through a coil—is not part of and never occurs in any embodiment of the present invention. Accordingly, no embodiment, or format, or arrangement of the present invention is constructed or employed as a solenoidal device.

Apparatus Version 5

A fifth embodiment of the apparatus optionally omits the coils from the construct and replaces part of the steel or other ferromagnetic material in the E-block mounting with a permanent magnet. However, such a change in structure means that the magnetic rigidity selected by the device can no longer be quickly adjusted. Adjustment of the traveling beam must now be made by changing the spacing of the components over a narrow range.

This alternative version works best with the field orientation as described above for Apparatus Version 4. That of Apparatus Version 3 is also possible, but net y deflection is difficult to control without additional coils 22; and adding such coils negates the benefit of permanent magnets. Also, for large sized beams, the cost of electricity to power the coils may be very significant—so if an application requiring a single beam species exists, the permanent magnet version may be markedly more advantageous.

Apparatus Version 6

Figure 11:
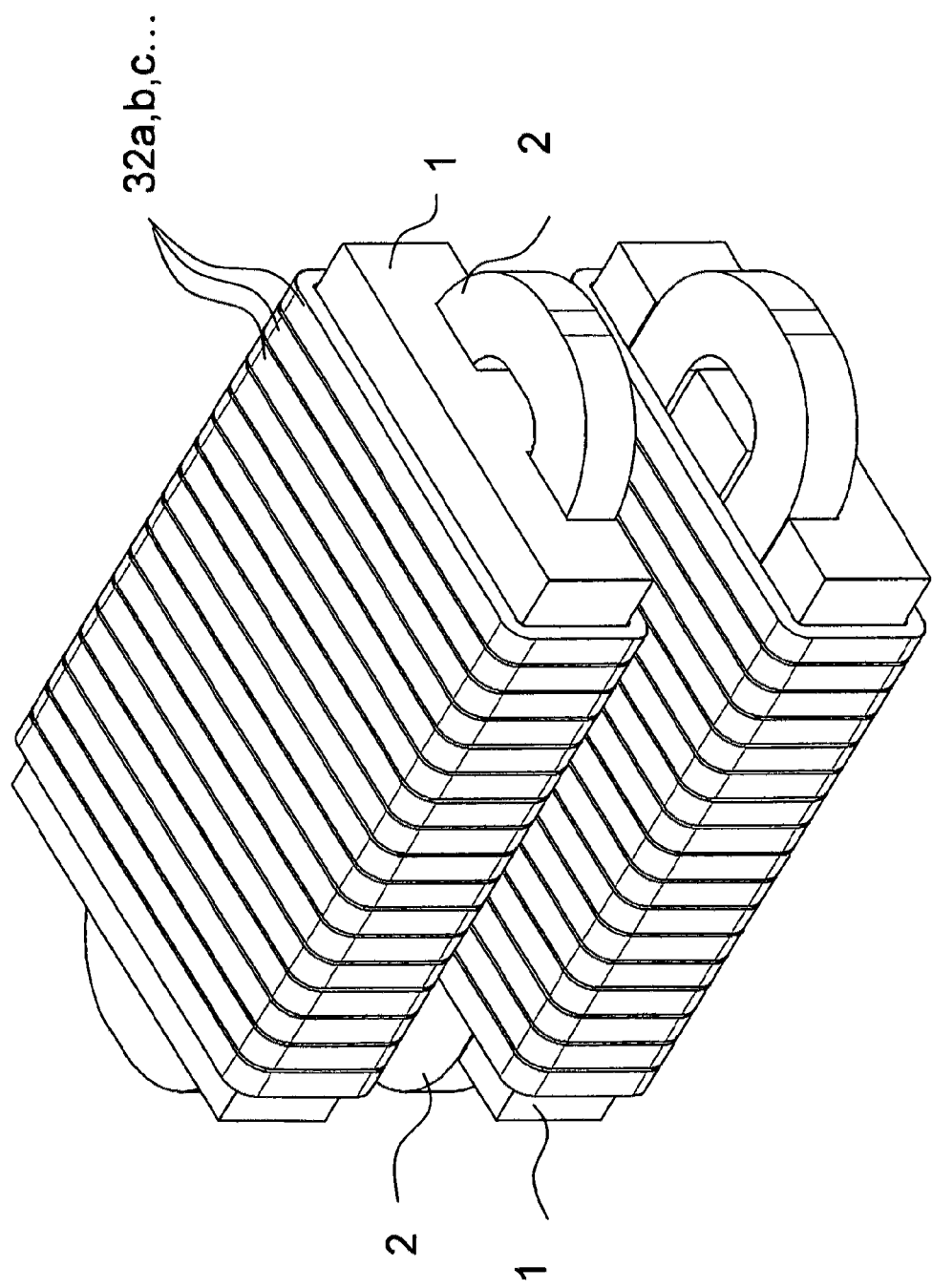
FIG. 11 shows a plurality of coils wound orthogonally around each E-block-coil unit, in an Apparatus Version 6 embodiment.

A sixth embodiment is an assembly which includes a plurality of supplemental obround coils 32 *a,b,c* . . . wound orthogonally to coil 2 and disposed over and around the exterior surfaces of each of the ferromagnetic E-shaped block mountings 1, as shown in FIG. 11. The supplemental coils 32 may be excited by passing electrical current through them, either individually or in pairs (grouped according to x-coordinate). Opposing sets of supplemental coils would usually be excited in opposite directions. These supplemental coils may be added to each E-shaped block mounting in any of Apparatus Versions 1-5 respectively; but for clarity, this description is limited to the addition and presence of such supplemental coils to Apparatus Version 4.

The supplemental coils have no effect on the functions previously described, because they lie in an orthogonal plane; but they superimpose on these previously described functions the ability to modulate the current uniformity of the ion beam, by varying the current in the supplemental coils. This particular function is identical to that described in U.S. Pat. No. 7,078,713, which description is expressly incorporated herein by reference. There is thus great economy in weight, space, and function—since this embodiment of the invention can provide a combination of focusing, mass selection, and control of uniformity in a single device.

IV. Summary Comparison of the Various Alternative Embodiments

A summary comparison and substantive review is given below which provides multiple points of relevant and material information for the practitioner concerning the present invention as a whole. This quality and quantity of descriptive detail is presented here in order that the true merits of the invention be recognized and appreciated for what they really are.

1. As concerns the present invention, the y-deflection capability and the y-focusing attributes are generated in the following manner:

Because at all points other than near the curved ends of the closed obround-shaped coils, the magnetic fields lie parallel to the y-z plane; and it is impossible for these magnetic fields to impart any y-directed deflection to charged particles then traveling in the y-z plane. However, even though the input ribbon-shaped ion beam may only comprise charged particles traveling parallel to the y-z plane, as these particles begin to traverse the magnetic field, the y-component of the magnetic field deflects these charged particles in the (positive or negative) x-direction.

Note also that an x-directed component of ion motion in a region with a z-directed component of magnetic field will generate a y-directed deflection.

Thus, in Apparatus Versions 1, 2 or 3 of the invention described above, the amount of x-deflection is almost independent of the y-coordinate of the ions; whereas in Apparatus Versions 4 (where the current in one of the closed coils is reversed and the individual currents in the two discrete closed coils are opposed in charge/polarity), the amount of x-deflection depends on the y-coordinate of the ion, and falls to zero on the central symmetry plane.

Figure 7B:
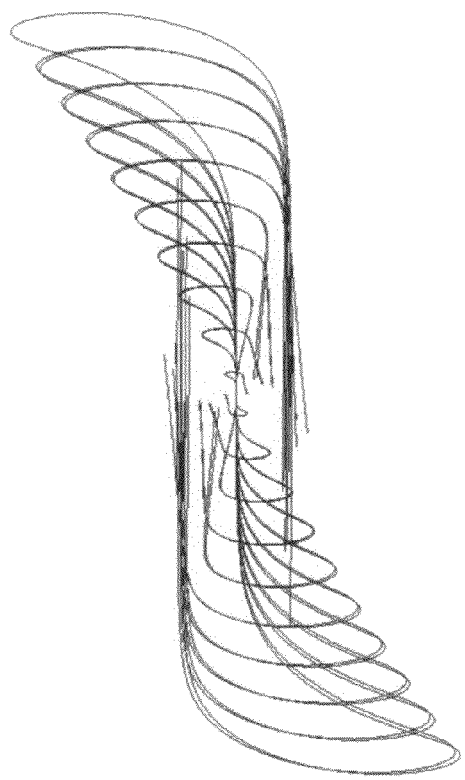
FIG. 7b is an orthographic view directly along z axis of a bunch of approaching ion trajectories, and shows the projection of the deflections in the fields.
Figure 7A:
FIG. 7a is a perspective view of a section of beam passing through an Apparatus Version 4 embodiment.

FIG. 7*a* shows a perspective view of these ions transiting the apparatus constituting Apparatus Version 4. FIG. 7*b* presents a view looking along the z-axis at the ion beam passing transversely over the mass analyzer apparatus constituting Apparatus Version 4 of the present invention, and shows the curved path the ions take as a result of this y-directed deflection.

In all these alternative embodiments, the amount of z-component of magnetic field depends on the y-coordinate. This is because, according to Maxwell's curl equations:

$$\frac{\partial B_z}{\partial y} - \frac{\partial B_y}{\partial z} = 0$$

and $$B_z = 0$$

at $$y = 0$$

from which a Taylor expansion yields $$B_z = -y\frac{\partial B_y}{\partial z} + \ldots$$

(higher order terms)

2. Among the five different and alternative embodiments of the invention described above, Apparatus Version 4 is most preferred for general use. The reasons for this preference are clear:

(i) In Apparatus Versions 1, 2, and 3 respectively, the net deflection in the x-direction (depending on the current direction) is the sum of the positive deflection at the entrance and exit sites, plus the negative deflection from the central pole. This may be a non-zero value unless the magnetic field in the central region is well balanced by that present at the entrance and exit sites (in the opposite direction), and will likely require the use of or a pair of additional closed coils as shown in FIG. 4*b*.

However, in the embodiment of Apparatus Version 4, the net overall x-deflection is null because at y=0, $B_y$=0, giving zero x-deflection; and at off-axis positions, the overall symmetry means that the x-deflection obtained in the first half of the device is reversed in the second half. This device also provides better control of stray flux.

(ii) The effects of operating opposite coils with currents in opposing directions (as in FIG. 9*b*) as compared to opposite coils operating with currents in the same direction (as in FIG. 9*a*) are:

An elimination of all net x-steering of the beam;
A greatly reduced flux leakage to the exterior;
A slightly improved quality of focusing; and A requirement for about 40% more current for a given amount of y-focusing.

On balance therefore, the Apparatus Version 4 embodiment with opposing coil currents is most preferred.

(iii) The permanent magnet analog of Apparatus Version 5 in which the N pole of one E-block mounting faces a N pole on the opposite E-block mounting, and a S-pole on one E-block mounting faces a S pole on the opposite E-block mounting, is best suited for use at a single mass-energy combination.

3. In Apparatus Versions 4 and 5 of the invention, the key step is the generation of two discrete zones of symmetric magnetic field within the ion beam. In one zone, the magnetic field is aligned with the ion beam travel; and in the second zone, the magnetic field is reversed.

Also, a cusp is formed where the two magnetic field zones meet and oppose each other. This cusp extends in a transverse direction along the major dimension of the ribbon-shaped ion beam. Near this cusp, the magnetic field is of quadrupole form. To satisfy Maxwell's equations, the lines of flux enter and exit from the sides of the beam.

In addition, because of the planar symmetry, the lines of flux need not and do not exit from the ends of the major transverse direction of the beam. The fields are generated purely by means external to either side of the beam; no coil need surround the beam, nor need any magnetic device encompass the beam.

Furthermore, because the magnetic field integrates to zero value along the beam path, the magnetic field may be provided by use of permanent magnets without any electrical current; or coils may be used as described above. Such current variable coils allow for adjustment by varying the electrical current in magnitude and direction; while permanent magnets allow only for slight adjustment of the focusing conditions, by changing the mechanical positioning of the components, or by providing for the shunting of some magnetic flux by means of a movable shunt (as is commonly known to and routinely used by practitioners in this technical field).

4. It is useful here to consider the merits of Apparatus Version 4 (in comparison to the alternative embodiments) somewhat further. As described above, its structural conductors as seen in an x-y cross section lie at the vertices of a rectangular-shaped assembly; and by analogy with the conventionally known Panofsky quadrupole lens, the magnetic field generated at the center of the assembly resembles a quadrupole, such that $B_z=kz$ and $B_y=-ky$, $Bx=0$. However, inspection of the symmetry also reveals that there is local symmetry in the planes $z=+/-z_0/2$, and that $B_z$ decreases in magnitude on either side of these planes; and thus $$\frac{\partial B_z}{\partial z} = 0$$

at these planes.

Figure 8:
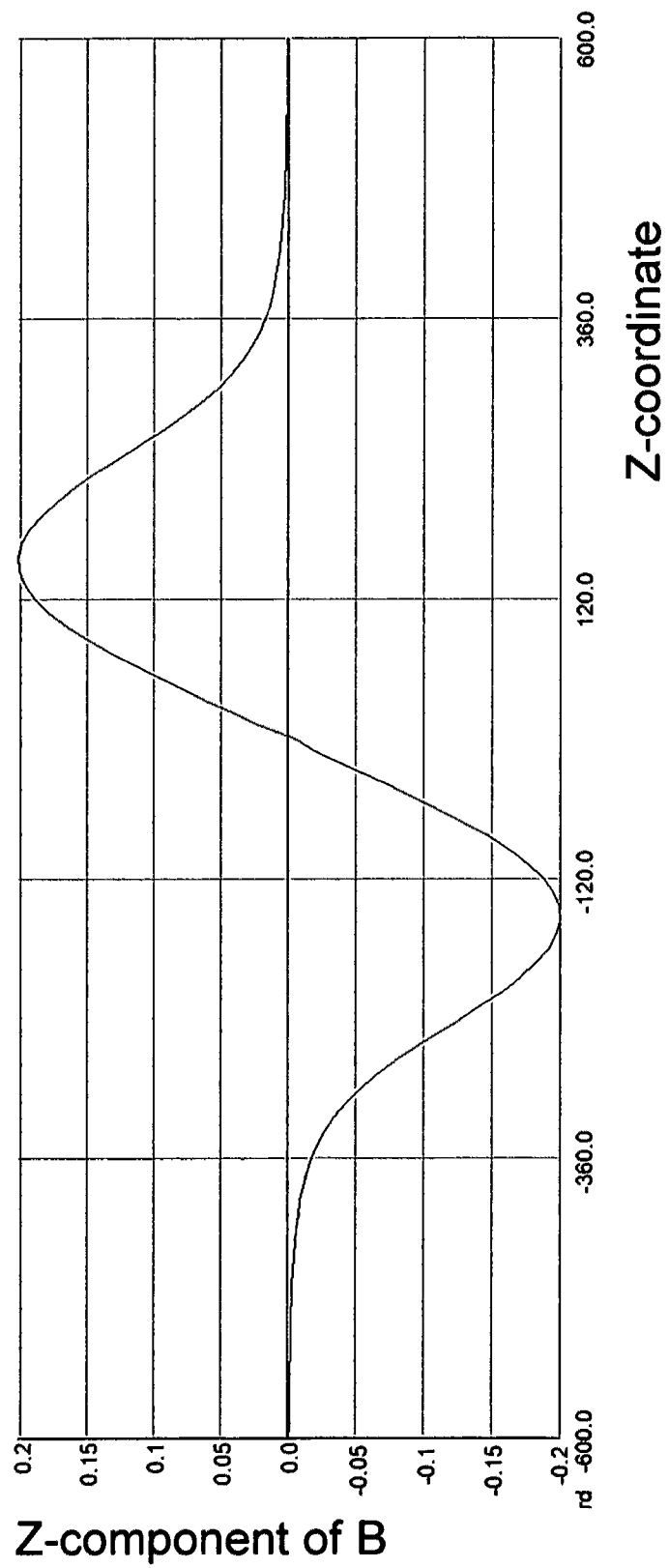
FIG. 8 shows a line plot of z-component of magnetic field along the z-axis.

Consequently, the quadrupole field behavior is only local; and the magnetic field as a whole can be analyzed as an expansion of the Maxwell equations about the mid xz plane where $B_z$ has the form shown in FIG. 8.

The amount of y-deflection is approximately linear with the distance from the center of the device, in either of Apparatus Versions 3 or 4; or to the distance from the flat ferromagnetic plate in Apparatus Version 2.

Note also that in Apparatus Version 1, the variation is much less linear. A linear variation generates well-behaved focusing with little to no aberration; however in all cases the aberration is quite significant.

5. Apparatus Version 4 in particular also can be employed as a focusing device. The twin and oppositely placed E-block-coil combinations of Apparatus Version 4 can be used—without any beam stops or apertures—to provide a lens which focuses in the x-direction, but which causes no focusing in the y-direction. See FIG. 9a for an illustrative representation of this capability and effect.

One possible application for this particular optional capability would be in matching a divergent ribbon-shaped beam from an ion source into another active device (for example, a deceleration structure) which tends to impart undesired focusing or causes defocusing of the ion beam. In such optional instances of use, the Application Version 4 embodiment will allow adjustment and control of the x-divergence, while not affecting the y-divergence.

Another optional use would be the transport of a beam from a deceleration structure (whose divergence is strongly dependent on current and energy) into a processing station where the ability to focus in the y direction without disrupting the beam in the x-direction, combined with the uniformity control of Apparatus Version 6, would be very effective.

6. The present invention as a whole can be employed for mass separation and selection. In general, mass separation requires a mass-dependent displacement ("dispersion" is the jargon most commonly used in the commercial industry)—combined with a well-controlled focus. A defining aperture is placed around the focus in the desired beam; and it will be recalled also that magnetic deflection is mass-dependent.

In these mass separation applications therefore, the ion beam is produced by placing the exit slot of an ion source and corresponding extraction electrodes near (but preferably slightly displaced from) the x-z plane; and the ion beam is directed at a small angle between about 5 and 10 degrees away from the mid-plane, so as to pass close to the E-core mounting, as shown in FIG. 9b.

A beam stop 3 is placed to block any ion trajectories passing too close to the x-z plane. An additional beam stop 4 (and possibly an extension of the first stop) is placed downstream of the E-core assemblies. An aperture containing barrier 8 may also be provided close to the additional beam stop, so as to provide two slot-like passages for beam ions, one on each side of the x-z plane. Each of these structural features is shown in FIGS. 4a and 9b respectively.

Figure 10:
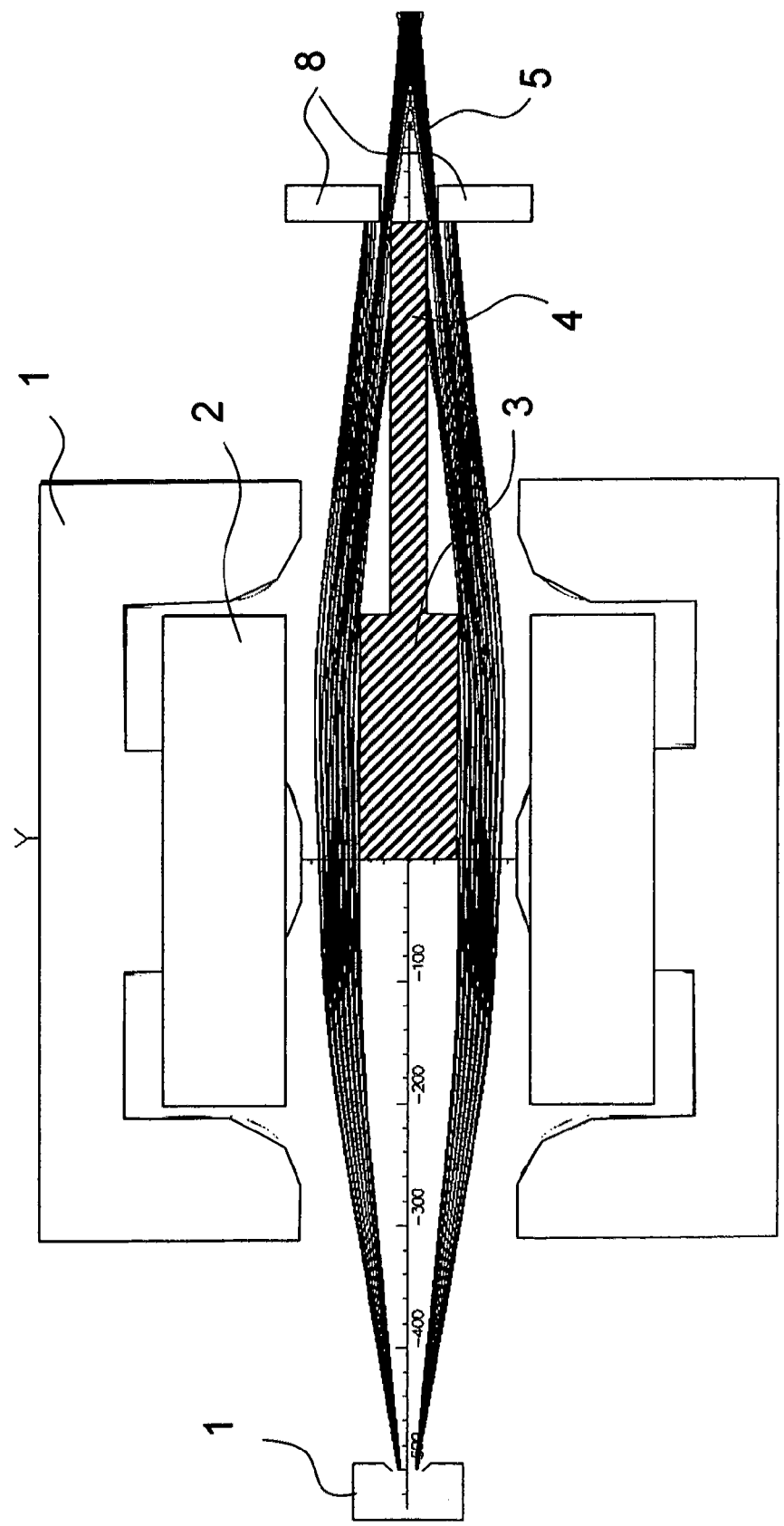
FIG. 10 is a numerical model of trajectories for 3 momenta, showing mass resolution.

With an ion beam (or pair of beams) containing the desired species accelerated to a selected energy, the current in the E-core assemblies is now adjusted until the desired ion species is focused through the apertures, as illustrated in FIG. 10. It will now be found that those ion species whose mass differs by more than a certain fraction from that of the desired ions are blocked, and are not transmitted. Typically a difference in mass of +/-20% or less is sufficient for rejection.

Moreover, in this apparatus, the dispersion is proportional to distance from either the midplane (Apparatus Versions 3, 4 and 5), or the flat boundary plate (Apparatus Version 2). However, the dispersion is a little harder to define for Apparatus Version 1, as it does not fall linearly to zero. The paths through regions where the dispersion is too small must be blocked; then with a resolving aperture placed at a suitable location, and the coil current adjusted to pass the desired beam species through this slot, the desired beam may be separated from contaminants.

The resolving power, expressed as $M/\Delta M$ FWHM, is not high; and FIG. 10 shows an example where the resolving power was >5. A reciprocal relationship exists between the resolving power and the width of beam in the y-direction that can be transmitted (which is determined by divergence from the ion source in practical situations).

7. Apparatus Versions 3, 4 or 5 of the present invention can be used to purify and merge two discrete ribbon-shaped ion beams generated from neighboring extraction slits from one ion source, or from a pair of ion sources simultaneously. The requirement is: Two ribbon-shaped ion beams of arbitrary extent in the x-direction, originating within one or two cm of each other—each with a full divergence of about 4 degrees, and with an 8 to 12-degree zone between the two beams in which there is no significant beam current.

The two diverging ion beams can both be accepted by the paired/twin E-block-coil combinations and refocused onto a target, while simultaneously the beam stops block unwanted species with different mass or energy, as shown in FIG. 10. Typical plasma extraction electrode systems produce an ion beam with a total angular spread of a few degrees, rarely less than 4 degrees; and in the figure illustrations, 4 degrees has been assumed.

The ion source can be provided with two parallel slits from which twin beams of ions are extracted, diverging from each other by between about ten and twenty degrees, symmetrically about the x-z plane. Thus each beam passes close to one of the two facing E-core assemblies. Details of the extraction electrodes are not shown (their use being well-established and conventionally known).

It is noted that the ion source described by Westner and Dudnikov [*Rev Sci Inst*, vol. 73, page 2, 2002] intrinsically generates two parallel ribbon beams; and as such, and can be used directly as shown in FIG. 10.

It is possible to efficiently generate a mass-analyzed ion beam of a desired species using the following steps:

Step 1: Providing an ion source having two parallel extraction slits from which a pair of ribbon-shaped ion beams, that are almost parallel but diverge from each other at a small angle, are extracted, each of said ion beams forming said pair containing a desired pure ion species and unwanted contaminant species of ions;

Step 2: Passing said pair of ion beams through a focusing device having chromatic aberration, wherein one beam passes on each side of a symmetry plane of said focusing device;

Step 3: Adjusting the focusing strength of said focusing device to direct both said ribbon beams concurrently through a single aperture symmetrically disposed on the symmetry plane downstream from the focusing device;

Step 4: Providing at least one beam blocking stop to intercept unwanted ions which travel too near the symmetry plane of the focusing device, and at least one beam blocking stop to intercept any ions which stray too far from the symmetry plane of the focusing device; and Step 5: Causing a separation of a desired pure ion species from unwanted contaminant species of ions in said pair of ion beams wherein said separation is made on the basis of the desired ion having at least one characteristically different physical property selected from the group consisting of a differing mass, charge, energy, and magnetic rigidity.

In performing this separation technique, the apparatus described above as Apparatus Versions 3, 4, or 5 respectively can provide the desired properties of focusing in a single dimension, of being extendible to encompass a ribbon beam as large as is desired, and of exhibiting strong chromatic aberration.

The present invention is not to be restricted in form not limited in scope except by the claims appended hereto:

What I claim is:

1. An apparatus suitable for focusing a traveling charged particle beam which is controlled in its size dimensions and will transversely pass adjacent to it, the beam's travel direction being substantially along the z-axis in a Cartesian coordinate system, said apparatus comprising:

a substantially E-shaped block mounting which
($\alpha$) is formed of ferromagnetic material,
($\beta$) is a preformed entity of predetermined size and dimensions having an exposed block face as its forward aspect and a flat exterior surface as its rearward aspect,
($\gamma$) has an exposed block face which presents at least three discrete and spatially distanced parallel raised ridges and at least two interposed and spatially distanced parallel recessed channels which are individually disposed along the x-axis direction and lie perpendicular to the z-axis travel direction of the charged particle beam,
($\delta$) is dimensionally extended in the x-axis direction for a linear distance greater than the x-axis dimension size of the traveling charged particle beam,
($\zeta$) is interactive with a charged particle beam traveling in the z-axis direction transversely over said exposed block face at a predetermined distance in the y-axis direction, wherein the transverse travel pathway of said beam is bounded by a pair of z-y planes adjacent and parallel to said E-shaped block mounting and by a pair of z-x planes normal to the forward aspect face of said E-shaped block mounting; and at least one magnetic field generating device which
(i) is transversely fitted to and is integral with at least one of said raised ridge structures of said E-shaped block mounting,
(ii) is transversely disposed in an x-z plane of said E-shaped block mounting at a predetermined y-axis coordinate position,
(iii) presents a plurality of straight length sections, each of said straight length sections lying in parallel and being greater in dimensional extent than the breadth dimension of the charged particle beam traveling along the z-axis over said exposed block face of said E-shaped block mounting,
(iv) is able to generate a magnetic field of predetermined strength on-demand whose breadth of magnetization lies along the x-axis and extends over said straight length sections,
  wherein along any beam travel pathway in the z-axis direction, the magnetic field so generated integrates to zero, and
  said generated magnetic field orthogonally extends along the y-axis, and
  said orthogonally extending magnetic field is dimensionally sufficient for charged particles of a prechosen mass then traveling within a beam to pass unobstructedly through said magnetic field in the z-axis direction across said exposed block face of said E-shaped block mounting, and
(v) is not configured as a solenoid coil through which the beam passes.

2. The apparatus as recited in claim 1 wherein said magnetic field generating device comprises
an obround-shaped closed coil wound from at least one electrical conductive material, and presenting two parallel straight lengths greater in extent than the x-axis dimension of the traveling charged particle beam and two curved ends each bending through 180 degrees, said closed coil being transversely fitted into and resting within the spatial volume provided by said two parallel recessed channels on the face of said E-shaped block mounting; and
connections for conveying an electrical current to said closed coil whereby said spatially distanced parallel raised ridges on the exposed face of said E-shaped block mounting form discrete magnetic poles of alternating polarity.

3. The apparatus as recited in claim 1 wherein said magnetic field generating device comprises
at least one permanent magnet transversely fitted to and electrically joined with said spatially distanced parallel raised ridges on the face of said E-shaped block mounting, whereby said spatially distanced raised ridges disposed on said exposed block face of said E-shaped block mounting form discrete magnetic poles of alternating polarity.

4. The apparatus as recited in claim 1 further comprising:
a flat ferromagnetic plate disposed in parallel to and set at a fixed gap distance from said exposed block face of said E-shaped block mounting such that the traveling charged particle beam will transversely pass through the spatial volume of said fixed gap distance between said ferromagnetic plate and said exposed block face of said E-shaped block mounting.

5. The apparatus as recited in claim 1 further comprising:
a plurality of orthogonally wound supplemental coils encircling the exterior surfaces of said E-shaped block mounting, wherein each of said supplemental coils is a wire winding; and
a source of on-demand electric current in communication with said plurality of orthogonally wound supplemental coils.

6. An assembly for focusing a traveling charged particle beam which is controlled in its size dimensions and will transversely pass adjacent to it, the beam's travel direction being substantially along the z-axis in a Cartesian coordinate system, said assembly comprising:
A pair of oppositely disposed and aligned pre-formed articles set spatially apart from each other at a fixed gap distance, and wherein the traveling charged particle beam will transversely pass in the z-axis direction through the spatial volume of said fixed gap distance between said pair of oppositely disposed articles,
wherein each said article of said oppositely disposed and aligned pair comprises
a substantially E-shaped block mounting which
(α) is formed of ferromagnetic material,
(β) is a preformed entity of predetermined size and dimensions having an exposed block face as its forward aspect and a flat exterior surface as its rearward aspect,
(γ) has an exposed block face which presents at least three discrete and spatially distanced parallel raised ridges and at least two interposed and spatially distanced parallel recessed channels which are individually disposed along the x-axis direction and lie perpendicular to the z-axis travel direction of the charged particle beam,
(δ) is dimensionally extended in the x-axis direction for a linear distance greater than the x-axis dimension size of the traveling charged particle beam,
(ζ) is interactive with a charged particle beam traveling in the z-axis direction transversely over said exposed block face at a predetermined distance in the y-axis direction, wherein the transverse travel pathway of said beam is bounded by a pair of z-y planes adjacent and parallel to said E-shaped block mounting and by a pair of z-x planes normal to the forward aspect face of said E-shaped block mounting, and
at least one magnetic field generating device which
(i) is transversely fitted to and is integral with at least one of said raised ridge structures of said E-shaped block mounting,
(ii) is transversely disposed in an x-z plane of said E-shaped block mounting at a predetermined y-axis coordinate position,
(iii) presents a plurality of straight length sections, each of said straight length sections lying in parallel and being greater in dimensional extent than the breadth dimension of the charged particle beam traveling along the z-axis over said exposed block face of said E-shaped block mounting,
(iv) is able to generate a magnetic field of predetermined strength on-demand whose breadth of magnetization lies along the x-axis and extends over said straight length sections,
wherein along any beam travel pathway in the z-axis direction, the magnetic field so generated integrates to zero, and
said generated magnetic field orthogonally extends along the y-axis, and
said orthogonally extending magnetic field is dimensionally sufficient for charged particles of a prechosen mass then traveling within a beam to pass unobstructedly through said magnetic field in the z-axis direction across said exposed block face of said E-shaped block mounting, and
(v) is not configured as a solenoid coil through which the beam passes; and
a fixed gap distance existing between said exposed block face of each E-shaped block mounting in said oppositely disposed and aligned article pair, wherein said fixed gap distance causes a spatial juxtapositioning of said orthogonally extending magnetic fields of limited breadth generated by said aligned pair of articles and is dimensionally sufficient for charged particles of a prechosen mass then traveling within a beam to pass unobstructedly between and across said exposed block face of each E-shaped block mounting in said oppositely disposed and aligned article pair.

7. The assembly as recited in claim 6 wherein said magnetic field generating device is one selected from the group consisting of
(i) at least one permanent magnet transversely fitted to and joined with said three spatially distanced parallel raised ridges on the face of said E-shaped block mounting whereby said spatially distanced raised ridges disposed on the face of said E-shaped block mounting form discrete magnetic poles of alternating polarity, and
(ii) an obround-shaped closed coil wound from at least one electrical conductive material and presenting two parallel straight lengths greater in extent than the x-axis dimension of the traveling charged particle beam and two curved ends each bending through 180 degrees, said closed coil being transversely fitted into and resting entirely within the spatial volume provided by said two parallel recessed channels on the face of said E-shaped block mounting, and
connections for conveying an electrical current to said obround-shaped closed coil whereby said spatially distanced parallel raised ridges on said exposed block face of said E-shaped block mounting form discrete magnetic poles of alternating polarity.

8. The assembly as recited in claim 6 wherein said pair of oppositely disposed and aligned pre-formed articles magnetically repel each other.

9. The assembly as recited in claim 6 further comprising:
at least one beam stop centrally located within the spatial volume of said fixed gap distance existing between said pair of oppositely disposed articles such that at least one off-center passage lane is formed within said fixed gap.

10. The assembly as recited in claim 9 additionally comprising:
a preformed aperture-containing barrier positioned downstream from and centered on the mid-plane of said pair of oppositely disposed and aligned pre-formed articles.

11. The assembly as recited in claim 6 further comprising:
a plurality of orthogonally wound supplemental coils encircling the exterior surfaces of each said E-shaped block mounting, wherein each of said supplemental coils is a wire winding; and
a source of on-demand electric current in communication with said plurality of orthogonally wound supplemental coils.

12. An assembly for focusing and separating desired ions of a certain narrow range of magnetic rigidity and rejecting other unwanted ions then present in at least one traveling charged particle beam which is controlled in its size dimensions, the beam's travel direction being substantially the z-axis direction in a Cartesian coordinate system, said assembly comprising:
a vacuum chamber enclosing a travel passageway of known spatial volume through which a charged particle beam will pass;
a pair of oppositely disposed and aligned pre-formed articles positioned within the spatial volume of said vacuum chamber, said oppositely disposed and aligned pair of articles being set spatially apart from each other at a fixed gap distance, and wherein the traveling charged particle beam will transversely pass in the z-axis direction through the spatial volume of said fixed gap distance between said pair of oppositely disposed and aligned pair of articles, and wherein each said article of said pair comprises
a substantially E-shaped block mounting which
($\alpha$) is formed of ferromagnetic material,
($\beta$) is a preformed entity of predetermined size and dimensions having an exposed block face as its forward aspect and a flat exterior surface as its rearward aspect,
($\gamma$) has an exposed block face which presents at least three discrete and spatially distanced parallel raised ridges and at least two interposed and spatially distanced parallel recessed channels which are individually disposed along the x-axis direction and lie perpendicular to the z-axis travel direction of the charged particle beam,
($\delta$) is dimensionally extended in the x-axis direction for a linear distance greater than the x-axis dimension size of the traveling charged particle beam,
($\zeta$) is interactive with a charged particle beam traveling in the z-axis direction transversely over said exposed block face at a predetermined distance in the y-axis direction, wherein the transverse travel pathway of said beam is bounded by a pair of z-y planes adjacent and parallel to said E-shaped block mounting and by a pair of z-x planes normal to the forward aspect face of said E-shaped block mounting, and
at least one magnetic field generating device which
(i) is transversely fitted to and is integral with at least one of said raised ridge structures of said E-shaped block mounting,
(ii) is transversely disposed in an x-z plane of said E-shaped block mounting at a predetermined y-axis coordinate position,
(iii) presents a plurality of straight length sections, each of said straight length sections lying in parallel and being greater in dimensional extent than the breadth dimension of the charged particle beam traveling along the z-axis over said exposed block face of said E-shaped block mounting,
(iv) is able to generate a magnetic field of predetermined strength on-demand whose breadth of magnetization lies along the x-axis and extends over said straight length sections,
wherein along any beam travel pathway in the z-axis direction, the magnetic field so generated integrates to zero, and
said generated magnetic field is an orthogonally extends along the y-axis, and
said orthogonally extending magnetic field is dimensionally sufficient for charged particles of a prechosen mass then traveling within a beam to pass unobstructedly through said magnetic field in the z-axis direction across said exposed block face of said E-shaped block mounting, and
(v) is not configured as a solenoid coil through which the beam passes, and
a fixed gap distance existing between said exposed block face of each E-shaped block mounting in said oppositely disposed and aligned article pair, wherein said fixed gap distance causes a spatial juxtapositioning of said orthogonally extending magnetic fields of limited breadth generated by said aligned pair of articles and is dimensionally sufficient for charged particles of a prechosen mass then traveling within a beam to pass unobstructedly between and across said exposed block face of each E-shaped block mounting in said oppositely disposed and aligned article pair;
at least one beam stop centrally located within the spatial volume of said fixed gap distance existing between said pair of oppositely disposed articles such that at least one off-center passage lane is formed within said gap distance; and
a preformed aperture-containing barrier which is positioned downstream from and is centered on the mid-plane of said pair of oppositely disposed and aligned pre-formed articles.

13. The assembly as recited in claim 12 wherein a pair of discrete ribbon-shaped ion beams concurrently travel together through said vacuum chamber, each of said discrete ion beams of said pair containing a desired ion species and unwanted species of ions.

14. A method of focusing a traveling ribbon-shaped ion beam controlled in its size dimensions, said method comprising the steps of:
obtaining a pair of oppositely disposed and aligned pre-formed articles set spatially apart from each other at a fixed gap distance, and wherein the traveling charged particle beam will transversely pass in the z-axis direction through the spatial volume of said fixed gap distance between said pair of oppositely disposed articles,
wherein each said article of said oppositely disposed and aligned pair comprises a substantially E-shaped block mounting which
($\alpha$) is formed of ferromagnetic material,
($\beta$) is a preformed entity of predetermined size and dimensions having an exposed block face as its forward aspect and a flat exterior surface as its rearward aspect,
($\gamma$) has an exposed block face which presents at least three discrete and spatially distanced parallel raised ridges and at least two interposed and spatially distanced parallel recessed channels which are individually disposed along the x-axis direction and lie perpendicular to the z-axis travel direction of the charged particle beam, (δ) is dimensionally extended in the x-axis direction for a linear distance greater than the x-axis dimension size of the traveling charged particle beam, (ζ) is interactive with a charged particle beam traveling in the z-axis direction transversely over said exposed block face at a predetermined distance in the y-axis direction, wherein the transverse travel pathway of said beam is bounded by a pair of z-y planes adjacent and parallel to said E-shaped block mounting and by a pair of z-x planes normal to the forward aspect face of said E-shaped block mounting, and at least one magnetic field generating device which (i) is transversely fitted to and is integral with at least one of said raised ridge structures of said E-shaped block mounting, (ii) is transversely disposed in an x-z plane of said E-shaped block mounting at a predetermined y-axis coordinate position, (iii) presents a plurality of straight length sections, each of said straight length sections lying in parallel and being greater in dimensional extent than the breadth dimension of the charged particle beam traveling along the z-axis over said exposed block face of said E-shaped block mounting, (iv) is able to generate a magnetic field of predetermined strength on-demand whose breadth of magnetization lies along the x-axis and extends over said straight length sections, wherein along any beam travel pathway in the z-axis direction, the magnetic field so generated integrates to zero, and said generated magnetic field orthogonally extends along the y-axis, and said orthogonally extending magnetic field is dimensionally sufficient for charged particles of a prechosen mass then traveling within a beam to pass unobstructedly through said magnetic field in the z-axis direction across said exposed block face of said E-shaped block mounting, (v) is not configured as a solenoid coil through which the beam passes, and a fixed gap distance existing between said exposed block face of each E-shaped block mounting in said oppositely disposed and aligned article pair, wherein said fixed gap distance causes a spatial juxtapositioning of said orthogonally extending magnetic fields of limited breadth generated by said aligned pair of articles and is dimensionally sufficient for charged particles of a prechosen mass then traveling within a beam to pass unobstructedly between and across said exposed block face of each E-shaped block mounting in said oppositely disposed and aligned article pair;

generating a multi-zone symmetrical magnetic field via said pair of oppositely disposed and aligned pre-formed articles set spatially apart from each other at a fixed gap distance, said pair of oppositely disposed and aligned articles generating a symmetrical magnetic field which extends perpendicularly across said fixed gap distance, wherein the orientation of a first zone in the generated magnetic field is in the direction of travel of the ions in the beam, and the orientation of a second zone in the generated magnetic field in is in a direction opposite to that of said first zone of magnetic field; and causing the traveling ribbon-shaped ion beam to transversely pass through said generated multi-zone symmetrical magnetic field existing within the spatial volume of said fixed gap distance between said pair of oppositely disposed articles.

15. The method as recited by claim 14 further comprising the steps of:

mass analyzing the traveling ribbon-shaped ion beam by blocking the direct passage of ions through said first and second zones of said generated multi-zone symmetrical magnetic field, and routing the movement of the traveling beam through at least two restricted lane passages, wherein said restricted lane passages are not linearly aligned, and only those ions deflected within a predetermined range of angles by the effects of said first and second zones of symmetrical magnetic field are directed into one of said restricted lane passages.

16. The method as recited by claim 14 further comprising the step of reversing the polarity of said first and second zones of symmetrical magnetic field.

17. A method for concurrently generating a mass-analyzed pair of discrete ion beams wherein each beam is controlled in its size dimensions and contains a desired ion species and unwanted ion species, said method comprising the steps of:

providing an ion source having two parallel extraction slits from which a pair of discrete ion beams that are almost parallel in trajectory but diverge from each other at a small angle are extracted, each of said extracted ion beams of said pair containing a desired ion species and at least one unwanted species of ion;

obtaining a focusing apparatus comprising a pair of oppositely disposed and aligned pre-formed articles set spatially apart from each other at a fixed gap distance, wherein the traveling charged particle beam will transversely pass in the z-axis direction through the spatial volume of said fixed gap distance between said pair of oppositely disposed articles, and wherein each said article of said oppositely disposed and aligned pair comprises a substantially E-shaped block mounting which (α) is formed of ferromagnetic material, (β) is a preformed entity of predetermined size and dimensions having an exposed block face as its forward aspect and a flat exterior surface as its rearward aspect, (γ) has an exposed block face which presents at least three discrete and spatially distanced parallel raised ridges and at least two interposed and spatially distanced parallel recessed channels which are individually disposed along the x-axis direction and lie perpendicular to the z-axis travel direction of the charged particle beam, (δ) is dimensionally extended in the x-axis direction for a linear distance greater than the x-axis dimension size of the traveling charged particle beam, (ζ) is interactive with a charged particle beam traveling in the z-axis direction transversely over said exposed block face at a predetermined distance in the y-axis direction, wherein the transverse travel pathway of said beam is bounded by a pair of z-y planes adjacent and parallel to said E-shaped block mounting and by a pair of z-x planes normal to the forward aspect face of said E-shaped block mounting, and at least one magnetic field generating device which (i) is transversely fitted to and is integral with at least one of said raised ridge structures of said E-shaped block mounting, (ii) is transversely disposed in an x-z plane of said E-shaped block mounting at a predetermined y-axis coordinate position, (iii) presents a plurality of straight length sections, each of said straight length sections lying in parallel and being greater in dimensional extent than the breadth dimension of the charged particle beam traveling along the z-axis over said exposed block face of said E-shaped block mounting, (iv) is able to generate a magnetic field of predetermined strength on-demand whose breadth of magnetization lies along the x-axis and extends over said straight length sections, wherein along any beam travel pathway in the z-axis direction, the magnetic field so generated integrates to zero, and said generated magnetic field orthogonally extends along the y-axis, and said orthogonally extending magnetic field is dimensionally sufficient for charged particles of a prechosen mass then traveling within a beam to pass unobstructedly through said magnetic field in the z-axis direction across said exposed block face of said E-shaped block mounting, (v) is not configured as a solenoid coil through which the beam passes, and a fixed gap distance existing between said exposed block face of each E-shaped block mounting in said oppositely disposed and aligned article pair, wherein said fixed gap distance causes a spatial juxtapositioning of said orthogonally extending magnetic fields of limited breadth generated by said aligned pair of articles and is dimensionally sufficient for charged particles of a prechosen mass then traveling within a beam to pass unobstructedly between and across said exposed block face of each E-shaped block mounting in said oppositely disposed and aligned article pair;

passing said pair of extracted ion beams through said focusing apparatus, wherein one of said beams passes on each side of a symmetry plane of said focusing apparatus;

adjusting the focusing strength of said focusing apparatus to direct the trajectories of both said beams concurrently through a single aperture-containing barrier disposed on the symmetry plane downstream from said focusing apparatus;

providing at least one beam blocking stop to intercept those ions which stray too near the symmetry plane of said focusing apparatus;

providing at least one beam blocking stop to intercept any ions which stray too far from the symmetry plane of said focusing apparatus; and causing a separation of a desired ion species from unwanted species of ions in said pair of traveling ion beams wherein said separation of ion species is made on the basis of at least one physical attribute selected from the group consisting of ion mass differences, ion charge differences, beam energy differences, and magnetic rigidity differences.

* * * * *